(12) United States Patent
Udrea

(10) Patent No.: US 6,858,884 B2
(45) Date of Patent: Feb. 22, 2005

(54) LATERAL SEMICONDUCTOR DEVICE

(75) Inventor: Florin Udrea, Cambridge (GB)

(73) Assignee: Cambridge Semiconductor Limited (GB)

( * ) Notice: Subject to any disclaimer, the term of this patent is extended or adjusted under 35 U.S.C. 154(b) by 0 days.

(21) Appl. No.: 10/602,065

(22) Filed: Jun. 24, 2003

(65) Prior Publication Data

US 2004/0051141 A1 Mar. 18, 2004

Related U.S. Application Data

(60) Provisional application No. 60/391,431, filed on Jun. 26, 2002.

(51) Int. Cl.$^7$ .......................... H01L 29/74; H01L 31/111
(52) U.S. Cl. ........................................ 257/162; 257/328
(58) Field of Search ................................. 257/162, 212, 257/288, 328, 341, 342, 343, 401

(56) References Cited

U.S. PATENT DOCUMENTS

| | | | |
|---|---|---|---|
| 6,111,289 A | * | 8/2000 | Udrea .......................... 257/328 |
| 2002/0041003 A1 | | 4/2002 | Udrea et al. |
| 2002/0096708 A1 | | 7/2002 | Ahlers et al. |

FOREIGN PATENT DOCUMENTS

| | | |
|---|---|---|
| EP | 1 026 750 A1 | 8/2000 |
| GB | 2 380 056 | 3/2003 |
| WO | WO 00/35023 | 6/2000 |
| WO | WO 02/25700 A2 | 3/2002 |

OTHER PUBLICATIONS

Udrea et al., "3D RESURF double-gate MOSFET: A revolutionary power device concept," *Electronics Letters* 34(8):808–809 (1998).

Ng, R., et al., "Lateral Unbalanced Super Junction (USJ)/3D–RESURF for High Breakdown Voltage on SOI," Jun. 4, 2001, pp. 395–398.

Udrea, F., et al., "Lateral Insulated Gate Bipolar Transistor (LIGBT) Structure Based on Partial Isolation SOI Technology," May 8, 1997, pp. 907–909.

Chen, X.B., et al., "Lateral High–Voltage Devices Using an Optimized Variational Lateral Doping," Int. J. Electronics, 1996, vol. 80, No. 3, pp. 449–459.

Amberetu, M., et al., 150–V Class Superjunction Power LDMOS Transistor Switch on SOI, Jun. 4, 2002, pp. 101–104.

* cited by examiner

*Primary Examiner*—Hoai Pham
(74) *Attorney, Agent, or Firm*—Pillsbury Winthrop LLP

(57) ABSTRACT

A lateral semiconductor device (10) has a semiconductor layer (15) on an insulating substrate (16). The semiconductor layer (15) has a first region (12) of a first conduction type and a second region (13) of a second conduction type with a drift region (14) therebetween. The drift region (14) is provided by a third region (14") of the first conduction type and a fourth region (14') of the second conduction type. The third and fourth (drift) regions (14",14') are so arranged that when a reverse voltage bias is applied across the first and second regions (12,13) of the semiconductor layer (15), the third region (14") has locally in the proximity of the first region (12) an excess of impurity charge relative to the fourth region (14'), and the fourth region (14') has locally in the proximity of the second region (13) an excess of impurity charge relative to the third region (14"), and the total volume charge in the third region (14") is substantially equal to the total volume charge in the fourth region (14').

44 Claims, 34 Drawing Sheets

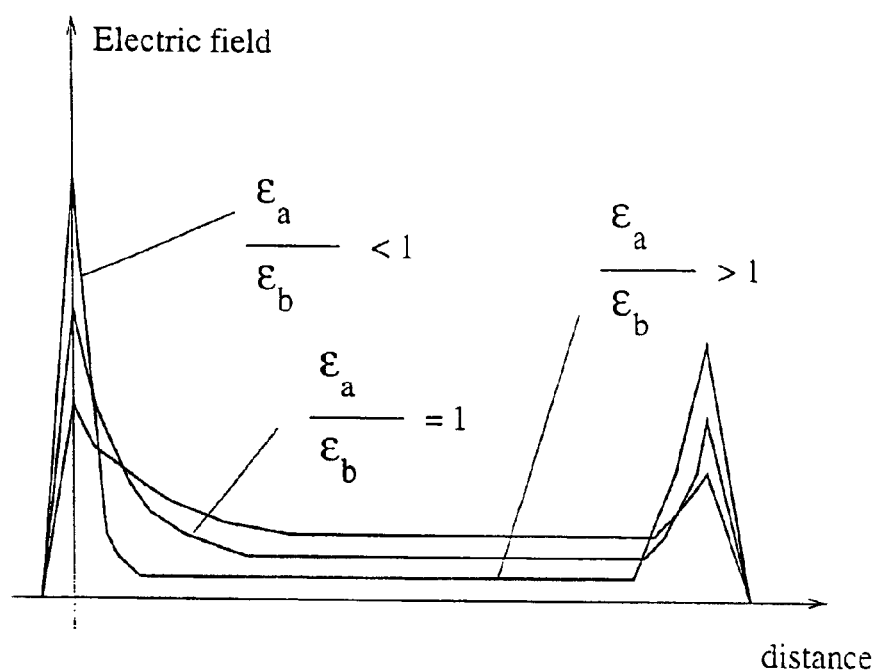
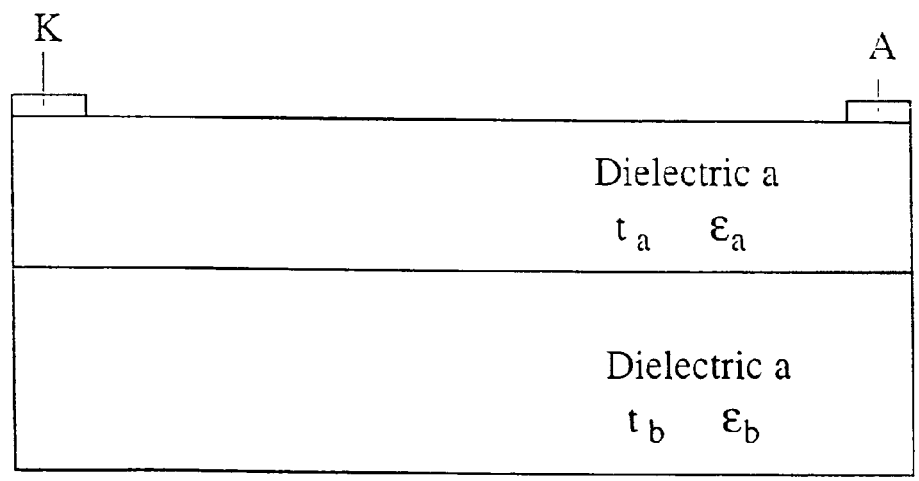
Figure 5

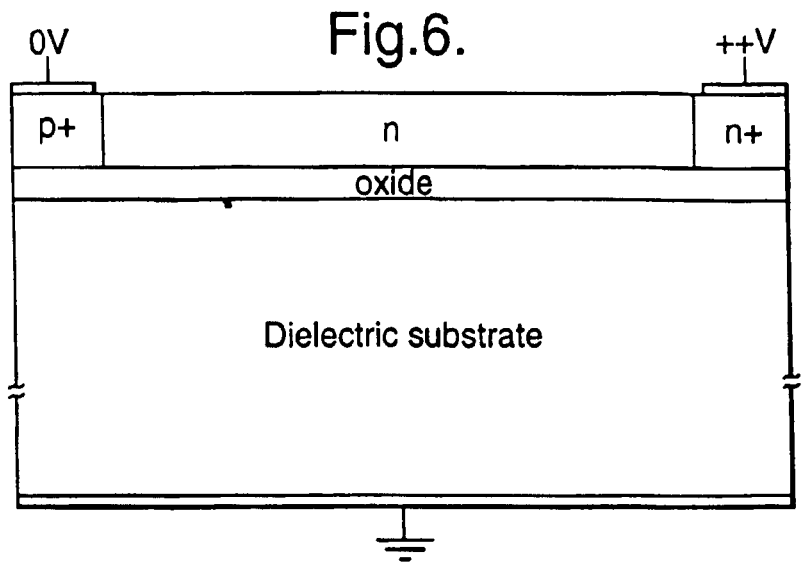
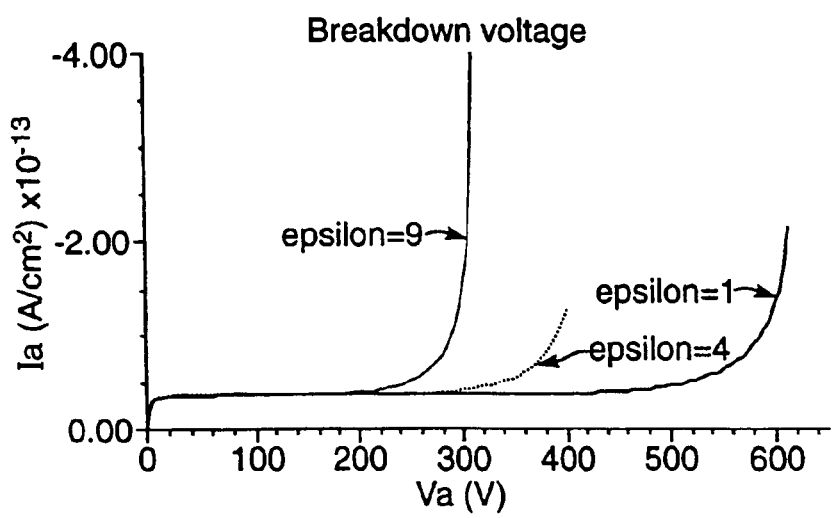
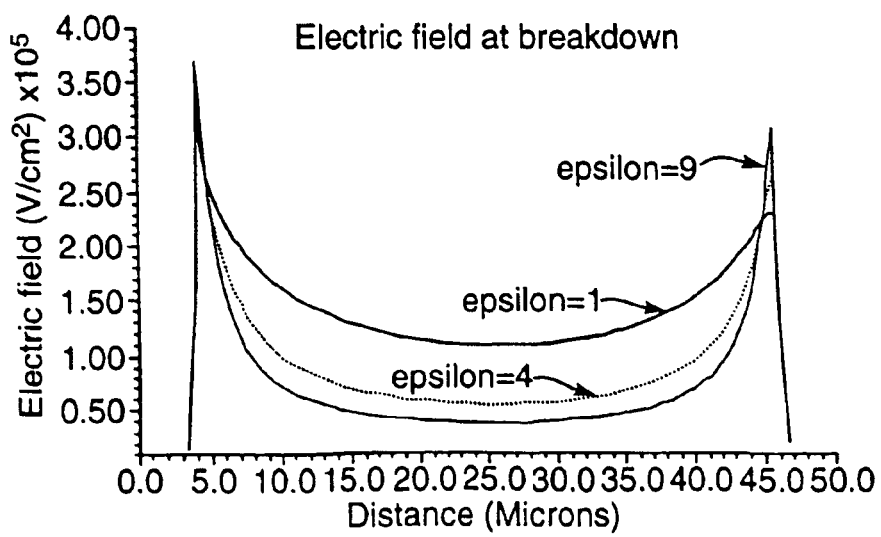
Fig.6.

Figure 7: PRIOR ART

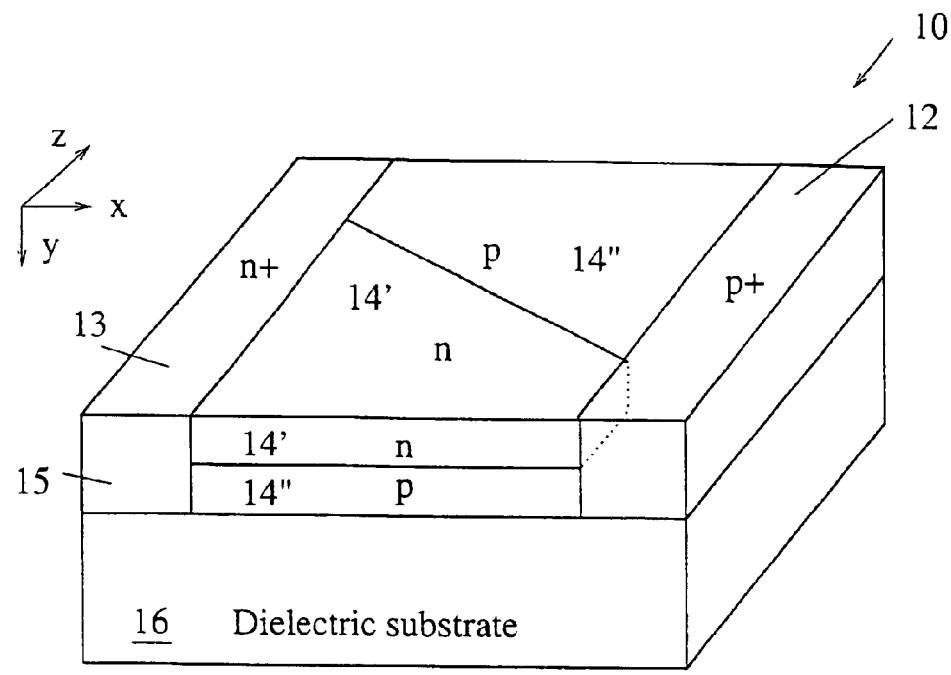
(a)
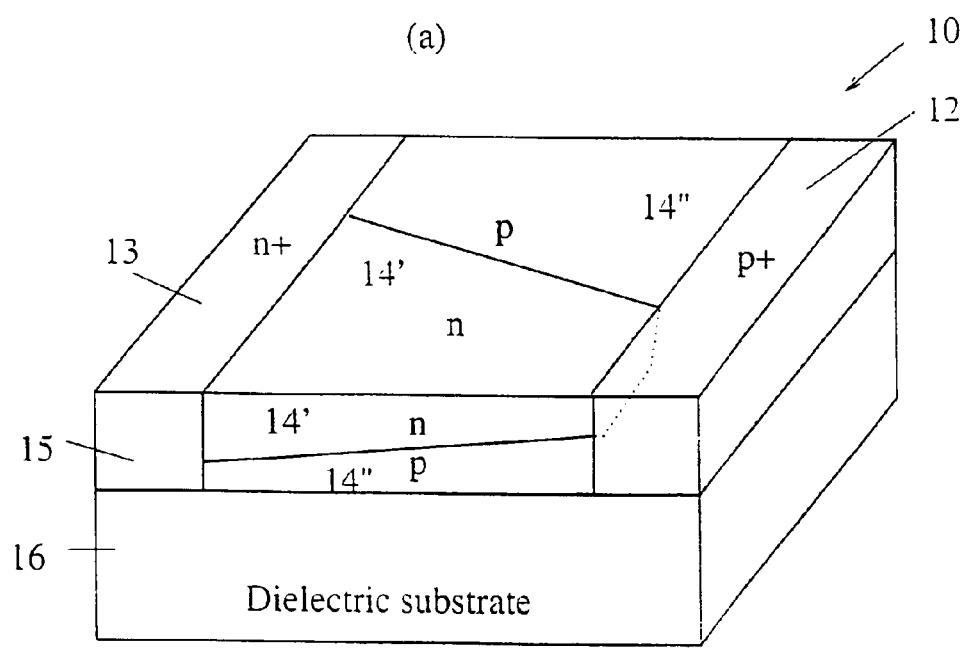
(b)
Figure 26

LATERAL SEMICONDUCTOR DEVICE

This application claims priority to U.S. provisional application No. 60/391,431, which was filed Jun. 26, 2002, the entire content of which is hereby incorporated by reference.

BACKGROUND OF THE INVENTION

1. Field of the Invention

The present invention relates to a lateral semiconductor device, particularly for use in integrated circuits.

2. Description of the Related Art

The present invention relates generally to high voltage lateral semiconductor devices manufactured by the use of an insulating substrate and is generally concerned with the distribution of the electric field in such devices. The insulating substrate consists of a dielectric material with a given permittivity $\epsilon_{in}$, and may be made of sapphire, diamond or other dielectric material. Alternatively the substrate may be formed by a combination of different materials (with different permittivities), such as silicon dioxide, nitride, aluminium nitride and the like. The dielectric material may also be air, as used in membrane technology as previously described in our WO-A-02/25700 and US-A-2002-0041003, the entire contents of which are hereby incorporated by reference. The semiconductor material placed above the dielectric substrate, into which the lateral device is formed, is commonly made of silicon. This type of structure is referred here as SOD (Semiconductor-on-Dielectric)

As shown schematically in FIG. 1, a typical lateral high-voltage diode 1 (which forms part of a semiconductor device such as Lateral MOSFET) fabricated using the SOD technology has a basic configuration of a p+ region 2 and an n+ region 3 at opposite ends separated by a central n drift region 4 of lower conductivity, all of which are formed in a semiconductor layer 5 which is formed on a dielectric layer 6. The p+ and n+ regions 2,3 are more highly doped than the n drift region 4. In the blocking/off-state mode of the diode, a high voltage reverse bias is applied to a terminal (not shown) connected to the n+ region 3 with respect to the terminal (not shown) placed on the p+ region 2. As the reverse bias is increased, a depletion layer develops across the p+/n junction 2/4. The bulk of the depletion layer forms within the n region 4 so that a significant portion of the applied reverse bias is sustained inside the n region 4.

During the blocking mode of operation, the voltage also develops in the insulating substrate 6. A schematic map of the potential lines is given in FIG. 2.

The diode 1 breaks down when the electric field within the semiconductor reaches the critical electric field in silicon, initiating avalanche of mobile carriers. The breakdown voltage can then be calculated approximately as the area under the electric field taken on a line AB at the surface of the device. The breakdown occurs commonly at the surface of the device. FIG. 3 shows a typical electric field distribution at the surface of the device when the device experiences breakdown. The insulating substrate plays an important role in the breakdown capability of the device. In particular, we found that the permittivity of the insulating substrate affects the electric field distribution at the surface of the semiconductor layer.

Ideally the n drift region 4 is completely depleted of carriers when a high reverse bias is applied between the diode terminals and the electric field is distributed uniformly at the surface of the device. In reality, due to a two-dimensional effect of the potential line distribution, in SOD structures there are two electric field peaks developing at the surface of the device, at the p+/n and n+/n junctions respectively. We have found that the lower the dielectric permittivity of the insulating substrate, the lower the electric field peaks in the semiconductor and hence the higher the breakdown voltage. We have also found that the electric field peaks are in fact dependent on the ratio between the electric permittivity of the semiconductor layer and that of the substrate. The higher this ratio, the lower the values of the electric field peaks at the p+/n and n+/n junctions resulting in higher breakdown voltage. While the argument was given here for an n drift region which is more lowly doped that the n+ and p+ regions, the same applies for a p type lowly doped drift region.

FIG. 4 shows the electric field distribution at the surface for two different dielectric permittivities of the substrate when the same reverse bias voltage is applied across the two terminals placed above the regions n+ and p+ 2,3. The permittivity of the semiconductor layer placed above the dielectric layer is the same in each case. It can be seen that the dielectric permittivity of the substrate affects strongly the electric field distribution at the surface of the semiconductor and that the lower the permittivity of the substrate with respect to that of the semiconductor, the more advantageous the lateral electric field distribution in the device in terms of the SOD structure breakdown.

To demonstrate that this effect is purely two dimensional and depends on the ratio between the permittivities and not the absolute values of the permittivities of the two layers one can consider the simpler situation where two dielectric layers are placed above each other and two electrodes are placed at the surface of the device on top of the first dielectric as shown in FIG. 5. If the two layers have different permittivities but the ratio is the same, the electric field distribution at the surface remains unchanged when the same voltage is applied across the two electrodes. FIG. 6(a) shows the distribution of the electric field in this case. If the ratio of the permittivities between the top layer and the bottom layer is higher, the peaks of the electric field at the surface are reduced as shown in FIG. 6(b). If the opposite is assumed (i.e. the ratio between the permittivity of the top layer and the bottom layer is lower), the peaks of the electric field in the vicinity of the electrodes are higher.

The SOD analysis is more complex than the example described above since it involves a semiconductor junction and a depletion region extending from the p+/n junction into the drift layer, but the physical concept is similar. FIG. 5 shows a cross-section of a semiconductor diode with a dielectric layer (oxide) and a dielectric substrate placed below; the breakdown voltage is a function of the permittivity of the dielectric substrate and the electric field distribution at the surface of the diode. The breakdown characteristics and the electric field distribution are obtained through advanced numerical simulations using standard semiconductor software. It can be seen from the electric field distribution that the lower the permittivity of the insulating substrate (e.g. $\epsilon_r=1$ for air) with respect to that of the semiconductor layer above (e.g. $\epsilon_r=11.9$ for silicon), the higher the voltage supported by the middle part of the drift region, thus releasing the "pressure" on the edges of the drift region in the vicinity of the p+/n and n+/n junctions. The numerical simulations of the diode breakdown shown in FIG. 5 also indicate that the breakdown is considerably affected by the dielectric substrate permittivity relative to the permittivity of the semiconductor layer.

It can be inferred from the analysis above that the lower the dielectric permittivity of the insulating (dielectric) substrate with respect to the semiconductor permittivity, the higher the breakdown ability of the SOD structure. In this respect the membrane technology which has air (with a relative permittivity of one) as the dielectric substrate is most advantageous. If a combination of dielectric materials is used in the substrate, it is advantageous that the permittivity of those materials be low. The thickness of the substrate also affects the surface distribution of the electric field and the higher this thickness the higher the breakdown voltage. However, above a certain thickness the effect is no longer visible. If a combination of dielectric materials is used, it is more advantageous that the material with lower permittivity be thicker than that with higher permittivity. For example if a membrane type structure is used for a high voltage lateral device as described in our WO-A-02/25700 and US-A-2002-0041003. Where a silicon dioxide layer is placed between the air and the semiconductor (which layer may be used as an etch-stop to form the membrane), it would be advantageous in terms of the breakdown ability that this layer be as thin as possible to reduce the electric field peaks at the surface of the semiconductor. This is because the silicon dioxide has a relative permittivity higher than that of the air.

The analysis above has assumed that the n drift region 4 shown in FIG. 1 is completely depleted of carriers during the off-state. This means that the doping of the drift region should be low. However, if the diode structure is used in a switching device such as a LDMOSFET, the low doping of the n drift region will result in an undesirable high on-state resistance. To break this trade-off, F. Udrea et al describe in "3D RESURF Double-Gate MOSFET: A revolutionary power device concept", Electronic Letters, vol.34, no.8, April 1998, a structure that allows the doping of the drift region 4 to be high while the structure is still depleted during the blocking-mode in the off-state. The prior art structure described in this paper is shown in FIG. 7. The 3D-RESURF concept is based on alternate n and p stripes with relatively higher doping than those used in standard diodes and their width significantly smaller than their length. When the reverse voltage is applied across the main terminals, the structure depletes first across the n/p stripes well before depletion of the n and p drift regions could occur caused by the electric field developed across the n+/p and p+/n junctions. This allows the doping of the drift layer to be raised above the level given by the one-dimensional condition of full depletion along the p+/n/n+ diode.

The structure was proposed on a SOI substrate, which generally has a silicon layer placed on a buried oxide, which in turn is placed on a semiconductor substrate. The structure is also applicable to SOD but the effect of the dielectric substrate is not discussed in the above cited paper.

In the paper "Lateral Unbalanced SuperJunction for high breakdown voltage on SOI" in Proceedings of 2001 International Symposium on Power Semiconductor Devices and ICs (ISPSD'01), p.395–398, June 2001 by R. Ng, F. Udrea et al, there is disclosed a 3D RESURF structure on an SOI substrate (the SOI substrate being formed by a semiconductor material which is separated from the active semiconductor layer through a buried insulating layer) based on alternate n/p drift regions which has a considerable excess of ion charge in the n drift region compared to that in the p drift region in order compensate for the negative charge in the inversion/accumulation layer formed under the buried oxide in the semiconductor substrate. This paper refers strictly to the situation of a semiconductor layer placed under a buried insulating layer. The excess of the charge in the n drift region compared to the p drift region is solely for the purpose of compensating the negative mobile charge in the inversion/accumulation layer (which is formed at the surface of the semiconductor substrate) underneath the buried insulating layer, thus achieving an overall compensation of charge in the structure, which leads to a higher breakdown voltage. This mobile charge is formed of electrons and is the result of a Metal-Oxide-Semiconductor effect when a high reverse voltage is applied to the high voltage terminal. Since in the SOD structure, which is used in the preferred embodiment of the present invention, there is no semiconductor substrate placed below the high voltage terminal, there is no mobile charge (mobile electrons) formed under the semiconductor layer below the high voltage terminal and therefore there is no need to have an overall increase in the charge of the n drift region compared to that of the p drift region.

These references do not discuss the contribution of a dielectric substrate placed under the semiconductor layer and hence do not propose any means of reducing the peaks at the two ends of the drift region caused by the non-zero dielectric permittivity of the substrate.

SUMMARY OF THE INVENTION

According to a first aspect of the present invention, there is provided a lateral semiconductor device, the device comprising a semiconductor layer on an insulating substrate, the semiconductor layer having a first region of a first conduction type and a second region of a second conduction type with a drift region therebetween, the drift region being provided by a third region of the first conduction type and a fourth region of the second conduction type, the third and fourth (drift) regions being so arranged that when a reverse voltage bias is applied across the first and second regions of the semiconductor layer, the third region has locally in the proximity of the first region an excess of impurity charge relative to the fourth region, and the fourth region has locally in the proximity of the second region an excess of impurity charge relative to the third region, and the total volume charge in the third region is substantially equal to the total volume charge in the fourth region.

According to a second aspect of the present invention, there is provided a lateral semiconductor device, the device comprising a semiconductor layer on an insulating substrate, the semiconductor layer having a first region of a first conduction type and a second region of a second conduction type with a drift region therebetween, the drift region being provided by a third region of the first conduction type and a fourth region of the second conduction type, the third and fourth (drift) regions being so arranged that when a reverse voltage bias is applied across the first and second regions of the semiconductor layer, the impurity charge in the third region varies with a positive slope along the device from the first region to the second region and the charge in the fourth region varies with a negative slope along the device from the first region to the second region and such that the total charge in the volume of the third region is substantially equal to the total charge in the volume of the fourth region.

The present invention provides a lateral device formed in a semiconductor layer placed on an insulating substrate in which the lateral device has a relatively high breakdown voltage.

In a preferred embodiment of the second aspect, the impurity charge in the third region varies substantially linearly with a positive slope along the device from the first region to the second region. In another preferred embodiment of the second aspect, the impurity charge in the fourth region varies substantially linearly with a negative slope along the device from the first region to the second region.

In an embodiment of either aspect, only part of the drift region is placed above an insulating substrate, the rest of the substrate comprising at least a region of semiconductor material.

In an embodiment of either aspect, the largest part of the drift region is placed above an insulating substrate such that the high voltage end of the drift region has no semiconductor layer underneath and the low voltage end of the drift region is positioned over a substrate that contains at least a region of semiconductor material. The high voltage end and low voltage end of the drift regions refer to the potential distribution within the depletion region of the drift region when the lateral semiconductor device is in the blocking mode and a high reverse-bias is applied across its main terminals.

In either aspect, the third (drift) region may be continuous along the device from the first region to the second region.

In either aspect, the fourth (drift) region may be continuous along the device from the first region to the second region.

In either aspect, the third (drift) region may be provided by or include a plurality of semiconductor islands in the fourth (drift) region. The islands may be electrically floating.

In either aspect, the fourth (drift) region may be provided by or include a plurality of semiconductor islands in the third (drift) region. The islands may be electrically floating.

In either aspect, the third (drift) region may include or be provided by a plurality of semiconductor islands in a common silicon background layer having lower doping than any of the third (drift) regions. The islands may be electrically connected to each other by the background layer if the background layer has the same conductivity type as the islands.

In either aspect, the fourth (drift) region may include or be provided by a plurality of semiconductor islands in a common silicon background layer having lower doping than any of the fourth (drift) regions. The islands may be electrically connected to each other by the background layer if the background layer has the same conductivity type as the islands.

In either aspect, the charge variation in the third and fourth regions is preferably a function of the permittivity of the insulating substrate such that the higher the dielectric permittivity of the insulating substrate the higher the slope of the charge variation in the third and fourth drift regions.

In either aspect, the charge variation in the third and fourth regions along the device structure from the first region to the second region may be achieved by varying the in-plane area of these regions. This may be achieved by changing the angle of the junction formed between the third and fourth regions relative to the junction formed between the first region with the third region and the second region with the fourth region respectively. This angle would preferably be 90 degrees in the ideal case of the dielectric permittivity of the insulating substrate being zero and preferably increases with increase in the actual dielectric permittivity of the substrate.

In either aspect, the charge variation in the third and fourth regions along the device structure from the first region to the second region may be achieved by varying the impurity doping concentration of these regions. This may be achieved by changing the slope of the doping profile in the third and fourth regions such that the doping concentration in the third region varies with a positive slope from the first region to the second region while the doping concentration in the third region varies with a negative slope from the first region to the second region such that the average doping concentration in the third region along the device structure from the first to the second region is substantially equal to the average doping concentration in the fourth region along the device structure from the first to the second region. The slope of the doping concentration variation is advantageously proportional to the dielectric permittivity of the substrate.

In either aspect, the third and the fourth regions may be placed adjacent to each other in the third dimension.

In either aspect, the third and fourth regions may be placed above each other. A plurality of these regions with alternate doping type may be placed on top of each other.

In either aspect, the semiconductor layer may comprise at least one of silicon, silicon-carbide, gallium-arsenide, gallium-nitride and III-V semiconducting materials.

In either aspect, the insulating (dielectric) layer may comprise at least one of air, sapphire, diamond, aluminium-nitride, silicon dioxide, silicon-nitride, any mould material used for IC packages, and passivation dielectric material known in microelectronics.

According to another aspect of the present invention, there is provided a MOS field effect transistor comprising a device as described above. The transistor may be for example a MOSFET or a double gate MOSFET.

According to another aspect of the present invention, there is provided a field effect transistor comprising a device as described above. The transistor may be for example a JFET.

According to another aspect of the present invention, there is provided a bipolar transistor comprising a device as described above.

According to another aspect of the present invention, there is provided a lateral insulated gate bipolar transistor (LIGBT) comprising a device as described above.

BRIEF DESCRIPTION OF THE DRAWINGS

Embodiments of the present invention will now be described by way of example with reference to the accompanying drawings, in which:

FIG. 5 shows schematically an example of two dielectrics with different permittivities and thicknesses placed on top of each other, the upper dielectric layer having two surface terminals across which a voltage is applied;

FIG. 6 shows an example of high voltage diode on a dielectric substrate, its breakdown characteristics function of the permittivity of the dielectric substrate, and the electric field distribution along the surface of the device for different permittivities of the dielectric substrate;

Figure 23:
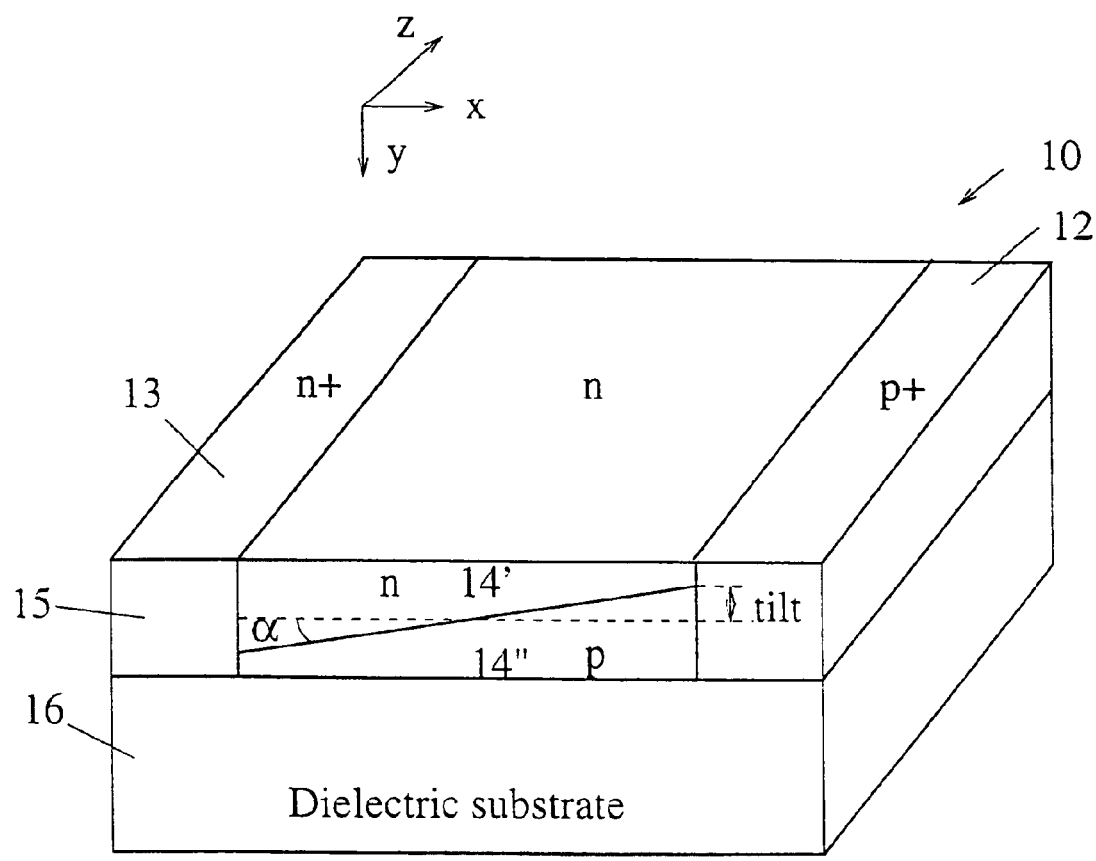
Figure 24:
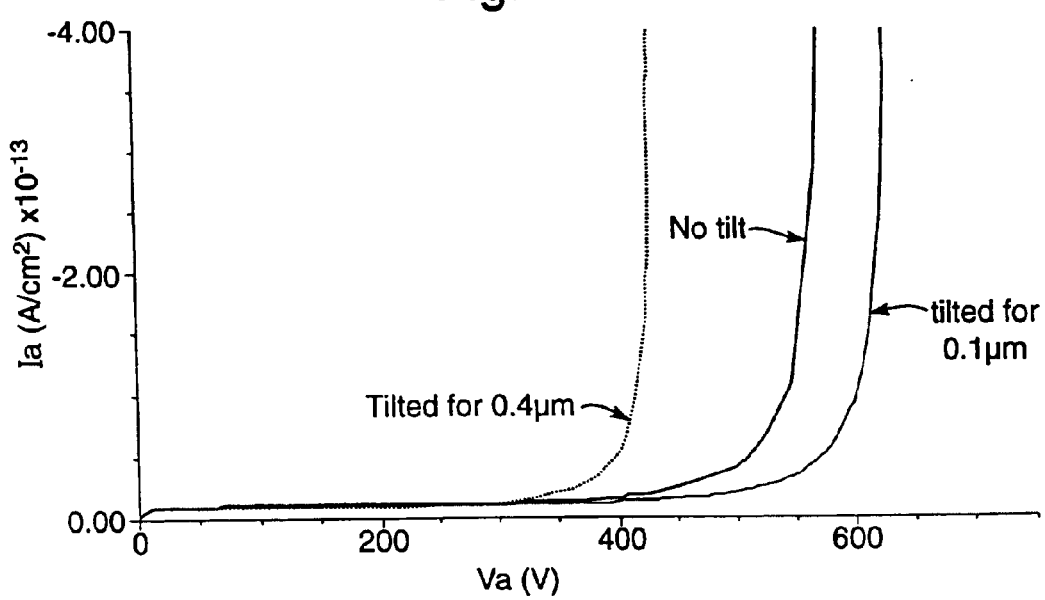
Figure 25:
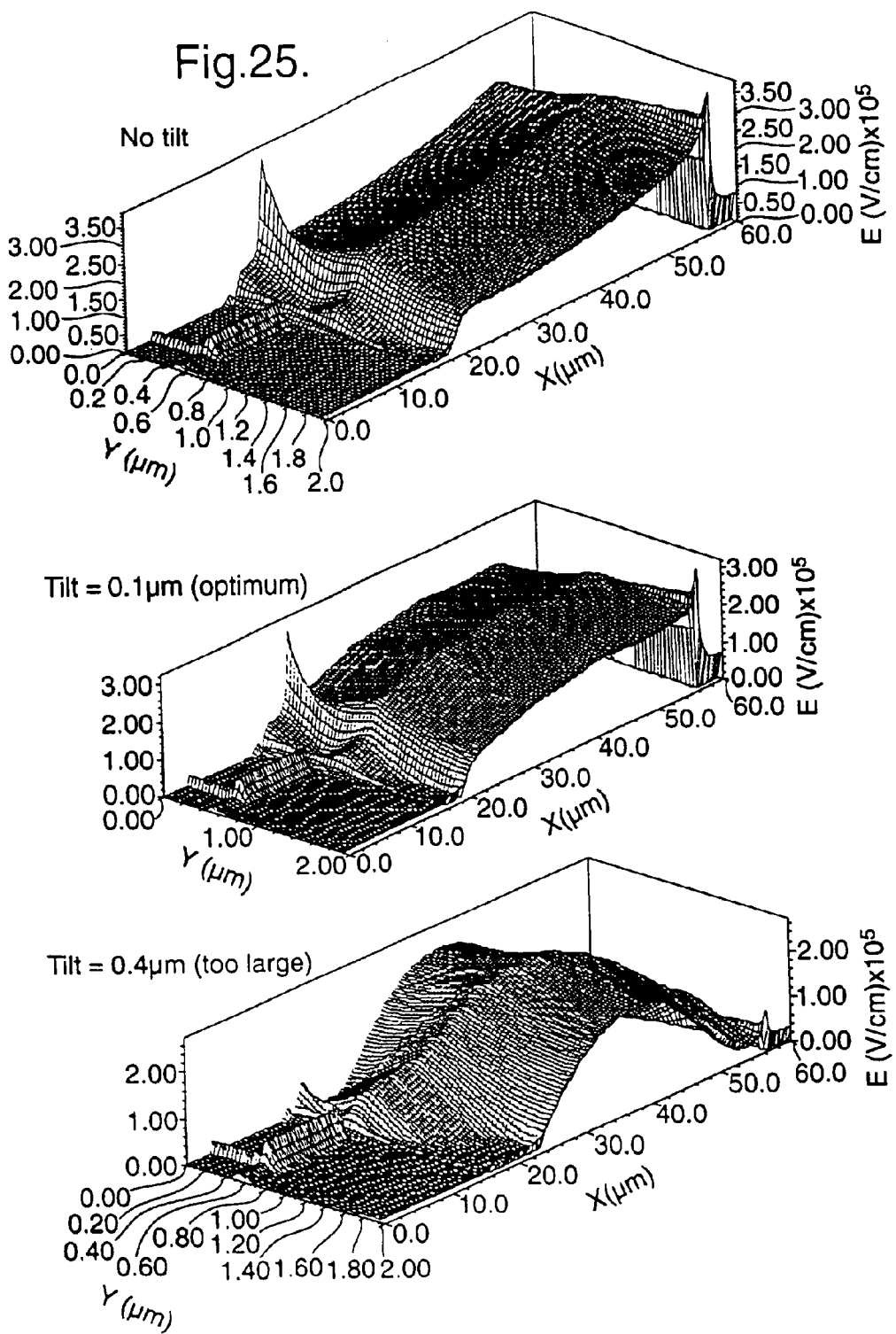

A revolutionary power device concept", Electronic Letters, vol.34, no.8, April 1998;

FIGS. 8 to 23 show schematically perspective views of examples of diode structures according to preferred embodiments of the present invention;

FIG. 24 shows schematically the breakdown characteristics for three examples of a "tilt" for the example of FIG. 23;

FIG. 25 shows schematically the two-dimensional electric field distribution in the drift region in a cross-section of the device of FIG. 23 at the breakdown voltage; and, FIGS. 26 to 34 show schematically perspective views of further examples of devices according to embodiments of the present invention.

DETAILED DESCRIPTION OF THE INVENTION

Figure 1:
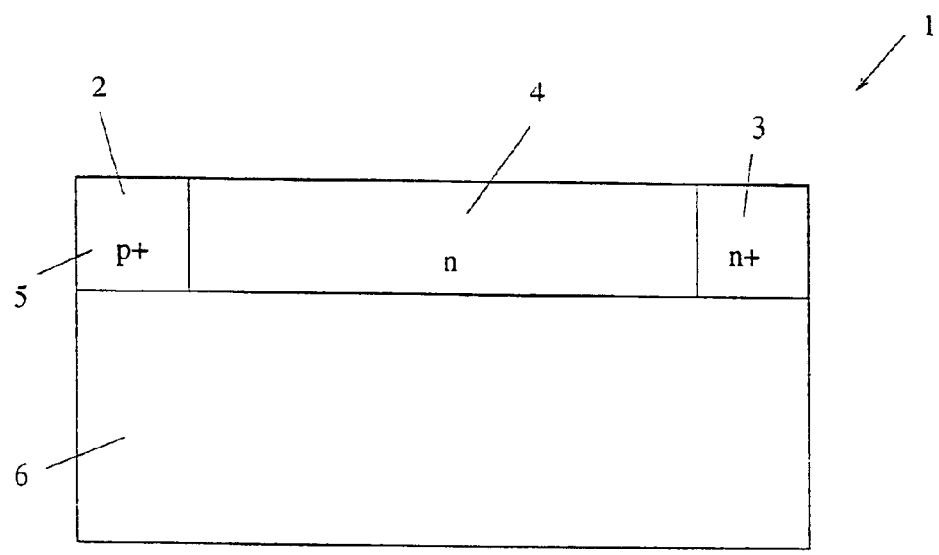
FIG. 1 shows schematically a basic diode structure as used in known Silicon-on-Dielectric structures (SOD)
Figure 2:
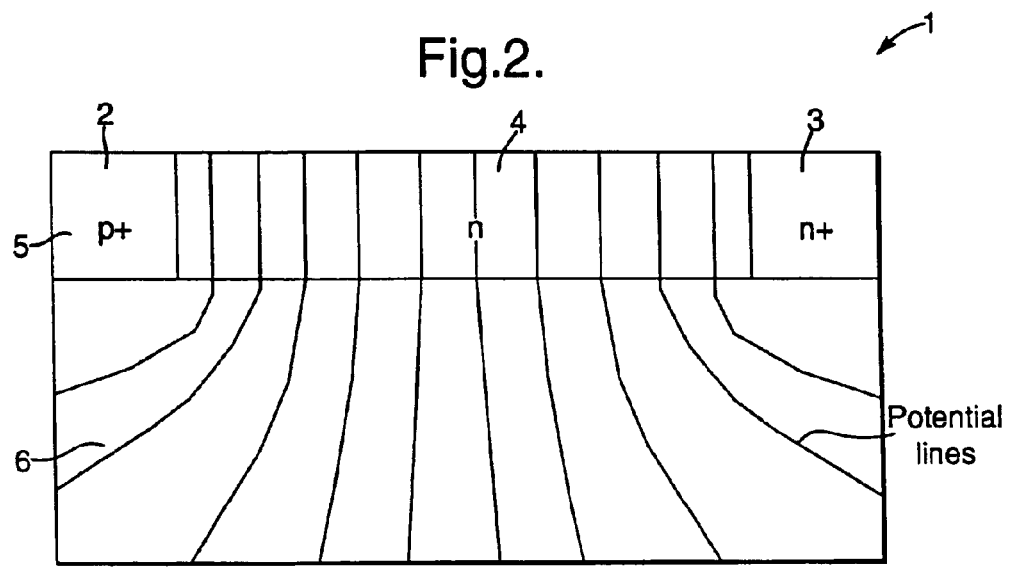
FIG. 2 shows graphically the potential line contour in a SOD basic diode.
Figure 3:
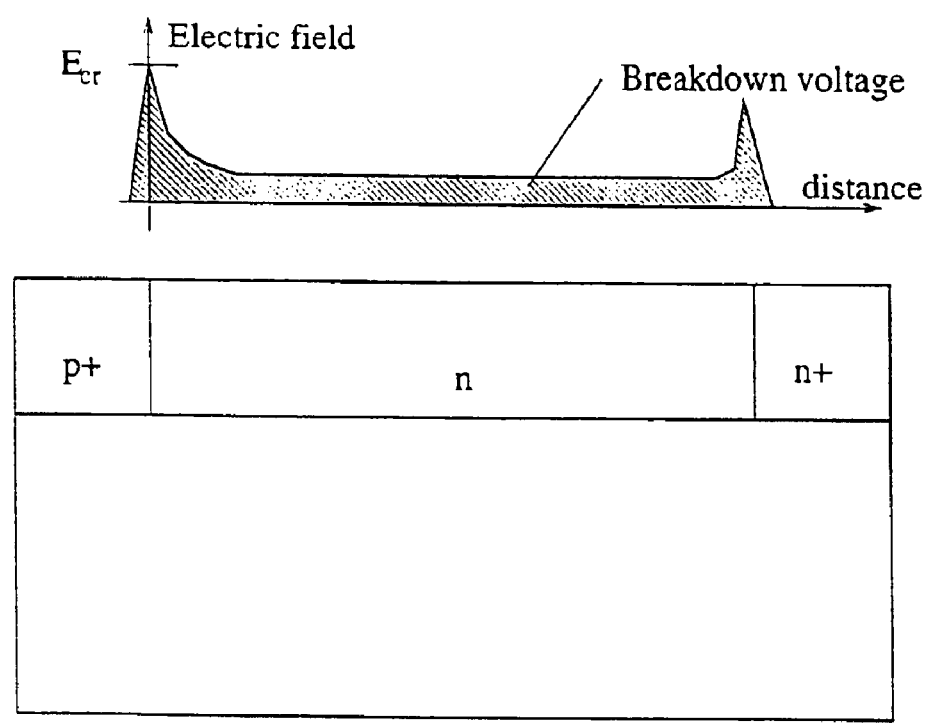
FIG. 3 shows schematically the electric field distribution at the surface of the semiconductor along a line from the p+ first region to the n+ second region of the device of FIG. 1 just before avalanche breakdown.
Figure 4:
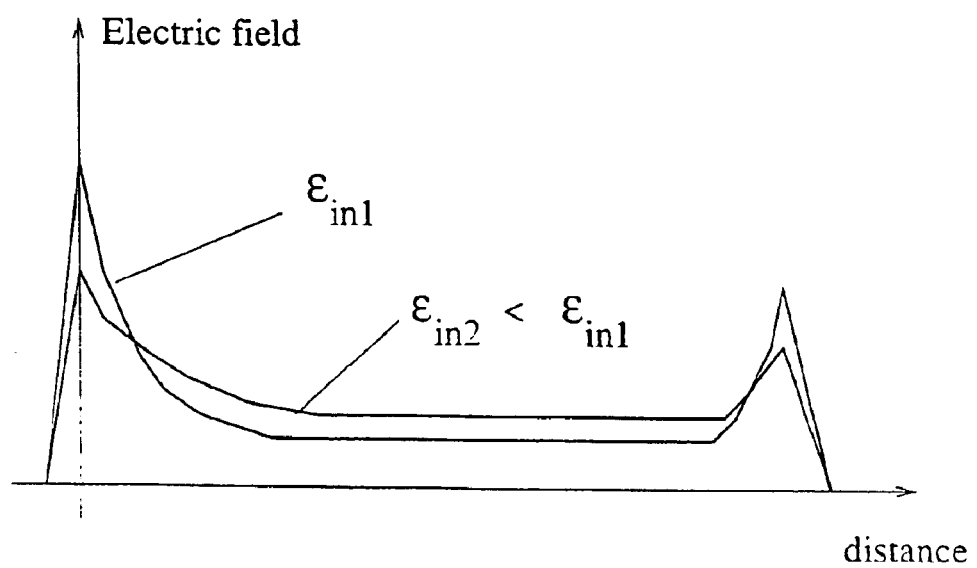
FIG. 4 shows schematically the electric field distributions at the surface of the SOD semiconductor layer of the device of FIG. 3 for two different dielectric permittivities of the semiconductor substrate for the same reverse voltage applied between the terminals of the diode.
Figure 7:
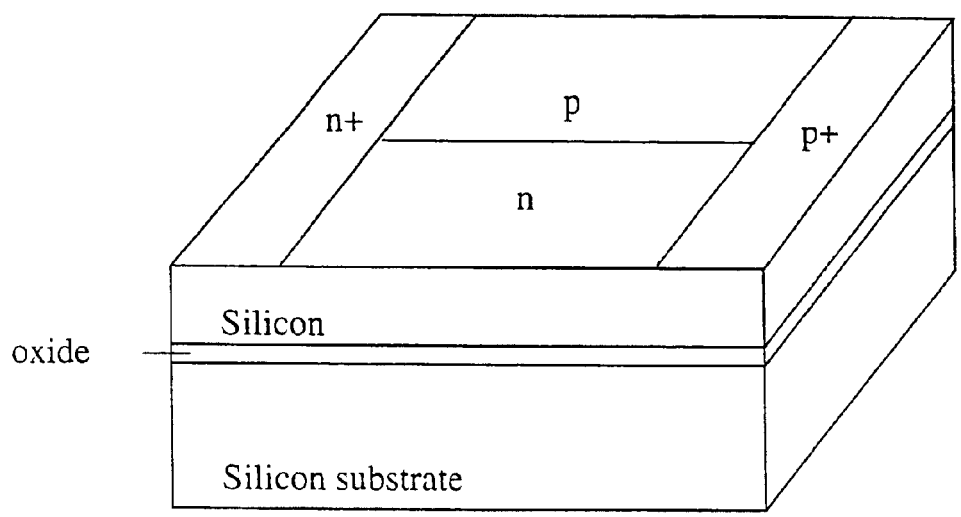
FIG. 7 shows schematically a prior art device described by F. Udrea et al in "3D RESURF Double-Gate MOSFET.
Figure 8:
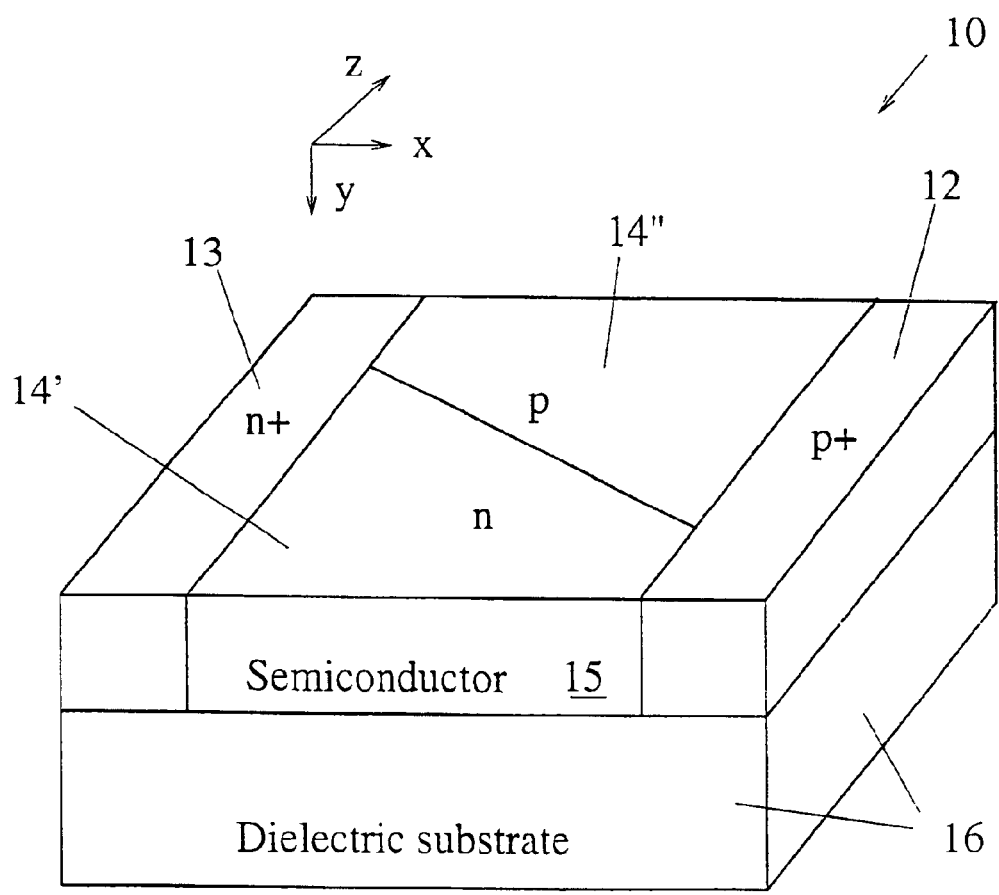

Referring now to the drawings, FIG. 8 shows schematically a perspective view of an example of a diode structure 10 according to a preferred embodiment of the present invention. The diode 10 can be used as a two terminal device but can also be part of a three terminal device, such as a MOSFET, IGBT, and bipolar transistor. In general the major role of the diode (whether independent or part of another power device) is to support the voltage while the device is in the off-state blocking mode (i.e. a reverse-bias is applied across its terminals) and to allow current conduction when a forward-bias is applied to its terminals. A p+ region 12 and an n+ region 13 are formed at opposed ends of the device 10 with a drift region 14 therebetween. The p+ region 12, n+ region 13 and drift region 14 are all formed in a semiconductor layer 15. The semiconductor layer 15 is commonly made of silicon or other known semiconductor and is itself formed on an insulating substrate 16. The drift region 14 in a practical application of the present invention can form the drift regions and channel regions of a MOS-controllable device, as will be discussed further below.

The drift region 14 of this example is subdivided into two sub-regions 14',14" with opposite conductivity type, n and p respectively. (In principle, it may be possible and even desirable to provide further sub-regions to the drift region 14.) The drift sub-regions 14',14" are so arranged such that when a reverse voltage bias is applied across the terminals connected to the p+ region 12 and n+ region 13 (e.g. the terminal (not shown) connected to the region 13 is biased with a positive voltage and the terminal (not shown) connected to the region 12 is fixed to ground), an excess of acceptor ion charge is formed in the drift sub-region 14" relative to the donor ion charge of the drift sub-region 14' in an in-plane cross-section of the device in the proximity of the p+ region 12 and further an excess of donor ion charge is formed in the drift sub-region 14' relative to the acceptor ion charge in the drift sub-region 14" in an in-plane cross-section of the device in the proximity of the n+ region 13. The total donor ion charge in the volume of the sub-region 14' may advantageously be equal to the total acceptor ion charge in the volume of the sub-region 14", or at least within say 5% or so. The donor ion charge in the sub-region 14' may vary linearly with a positive slope from the p+ region 12 to the n+ region 13. Symmetrically, the acceptor ion charge in the sub-region 14" may vary linearly with a descendent slope from the p+ region 12 to the n+ region 13. The gradient of the variation of the ion charge in the two sub-regions 14',14" may be advantageously proportional to the dielectric permittivity of the insulating substrate. The variation of the charge in the sub-regions 14' and 14" as shown in FIG. 8 is in this case achieved by varying linearly the area in an in-plane section of the sub-regions 14,14" with the distance from the p+ region 12 to the n+ region 13.

Figure 9:
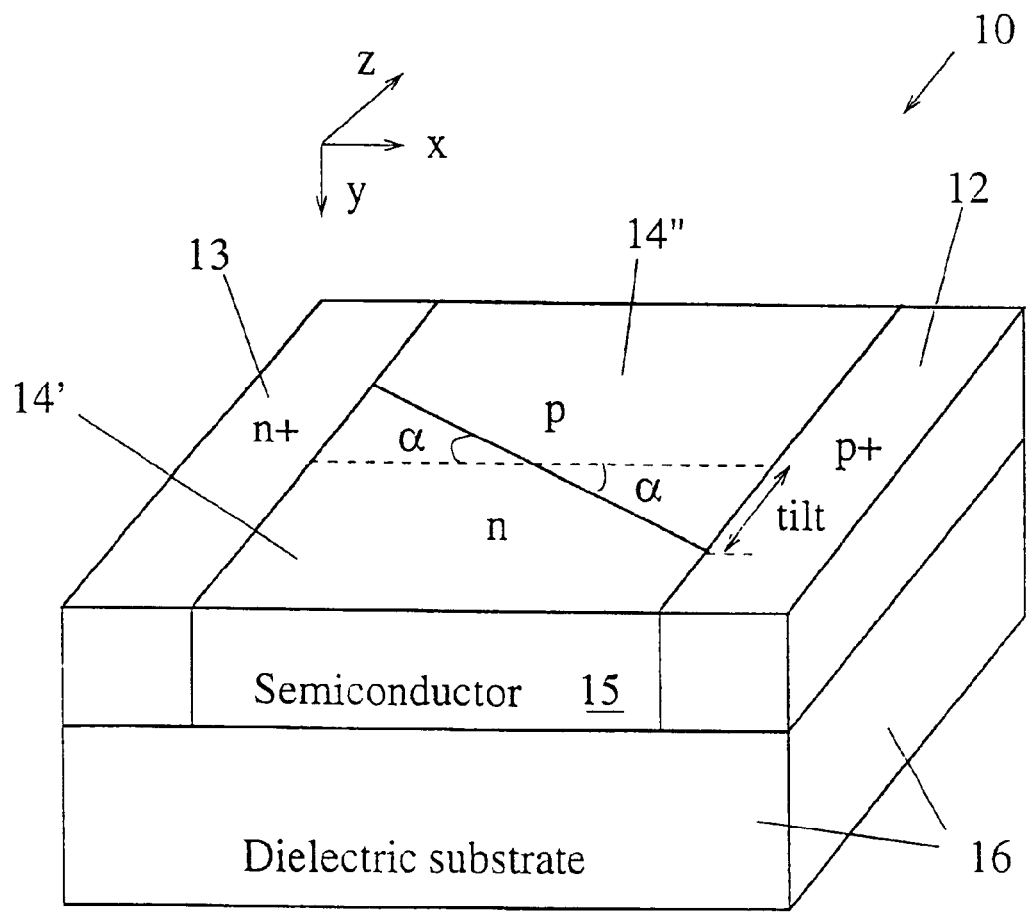

The deficit of charge in the drift sub-region 14' near the junction formed between the drift sub-region 14' and region 12 makes the depletion region advance faster (i.e. more deeply) into the sub-region 14' during reverse biasing, thus pushing the potential lines away from this junction (i.e. p+/n junction), thereby reducing the peak of the electric field at this junction. Symmetrically, the deficit of charge in the drift sub-region 14" near the junction with the region 13 makes the depletion region advance faster (i.e. more deeply) in the sub-region 14" during reverse biasing, thus pushing the potential lines away from this junction (i.e. n+/p junction), thereby reducing the peak of the electric field at this junction. The reduction of the peaks of the electric field at these junction results in a higher breakdown ability. Since the peaks at the p+/n and n+/p junctions are more prominent for a higher ratio between the permittivity of the dielectric substrate 16 and the permittivity of the semiconductor layer 15, the difference in charge between the two drift sub-regions 14',14" in an in-plane section near the p+/n and n+/p junctions should be greater. This means that the optimal angle α made by the transverse junction formed between the drift sub-regions 14',14" with the x axis as shown in FIG. 9 should increase with the permittivity of the dielectric substrate for a given permittivity of the semiconductor layer. It should be understood that a higher angle α than its optimum value results in an over-push of the electric field towards the middle of the structure and as a result the device breaks down in the middle of the drift region at the junction formed by the drift sub-regions 14' and 14". If the angle is smaller than its optimum value, the device will break at either the 12/14' (p+/n) or 13/14" (n+/p+) junctions.

Figure 10:
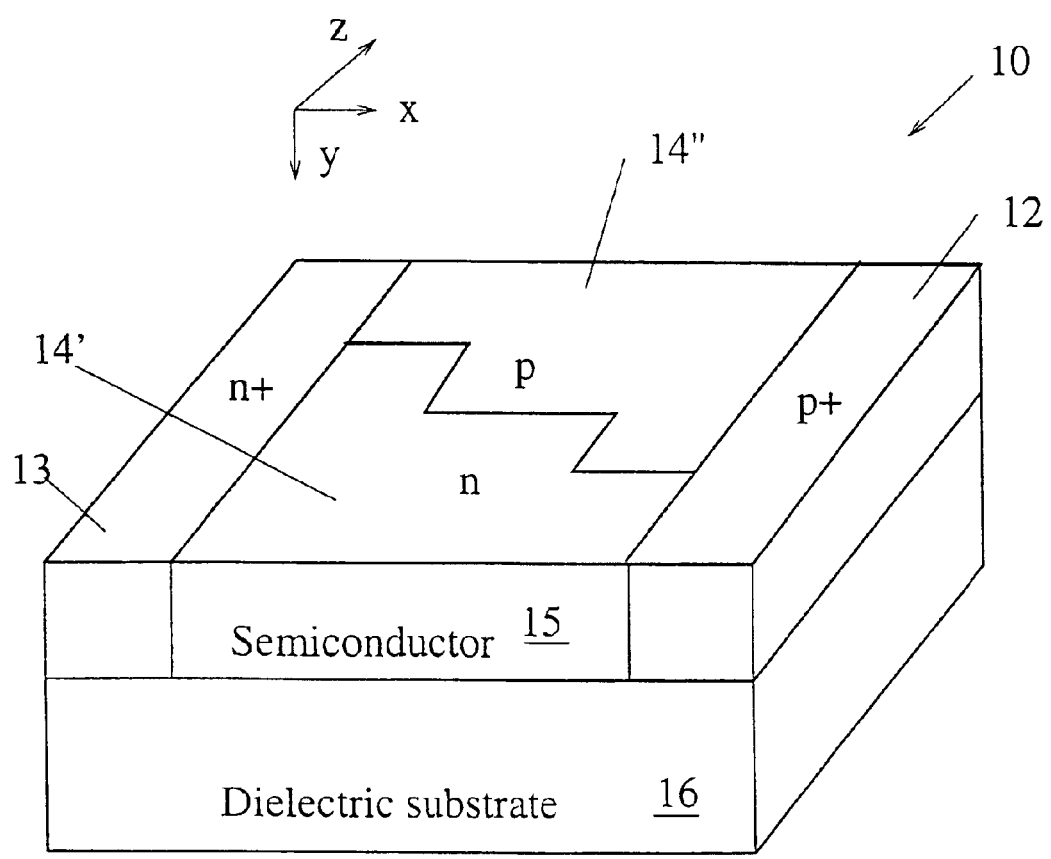

FIG. 10 shows a variation of the example shown in FIG. 9 whereby the transverse junction separating the drift sub-regions 14' and 14" has a non-linear geometrical shape (in the figure a step-like shape is shown) such that there is an excess of impurity charge (i.e. ion charge) in the sub-region 14' compared to the impurity charge in the drift sub-region 14" close to the region 13 and symmetrically there is an excess of impurity charge (i.e. ion charge) in the sub-region 14" compared to the impurity charge in the drift sub-region 14' close to the region 12.

Figure 11:
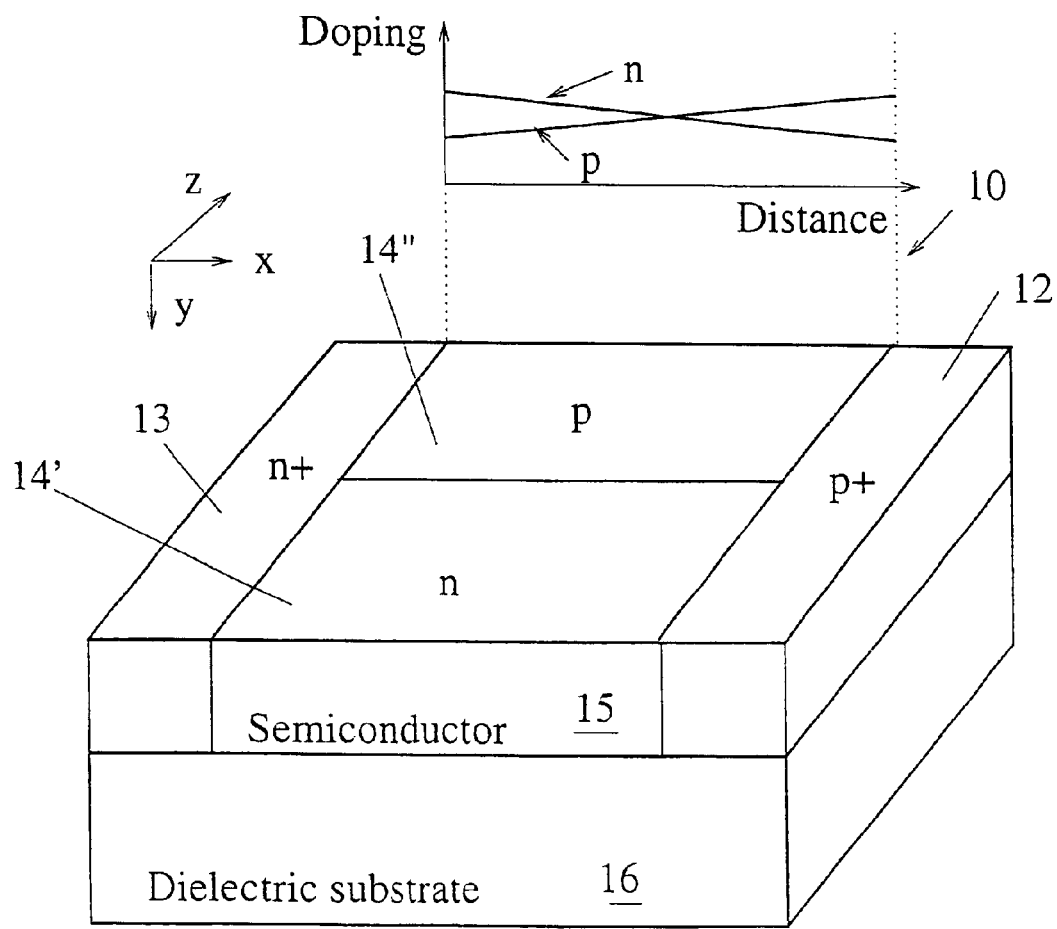

FIG. 11 shows another embodiment of this invention whereby the variation of the charge in the drift sub-regions is achieved through the variation of the doping profile in these regions. The variation of the doping profile in the sub-region 14' may be linear with a positive gradient from the p+ region 12 to the n+ region 13. Symmetrically the variation of the doping profile in the sub-region 14" may be linear with a negative gradient from the p+ region 12 to the n+ region 13. It is preferred that the gradient of the doping profile along the device structure in the sub-region 14' and 14" be proportional to the permittivity of the insulating substrate.

Figure 12:
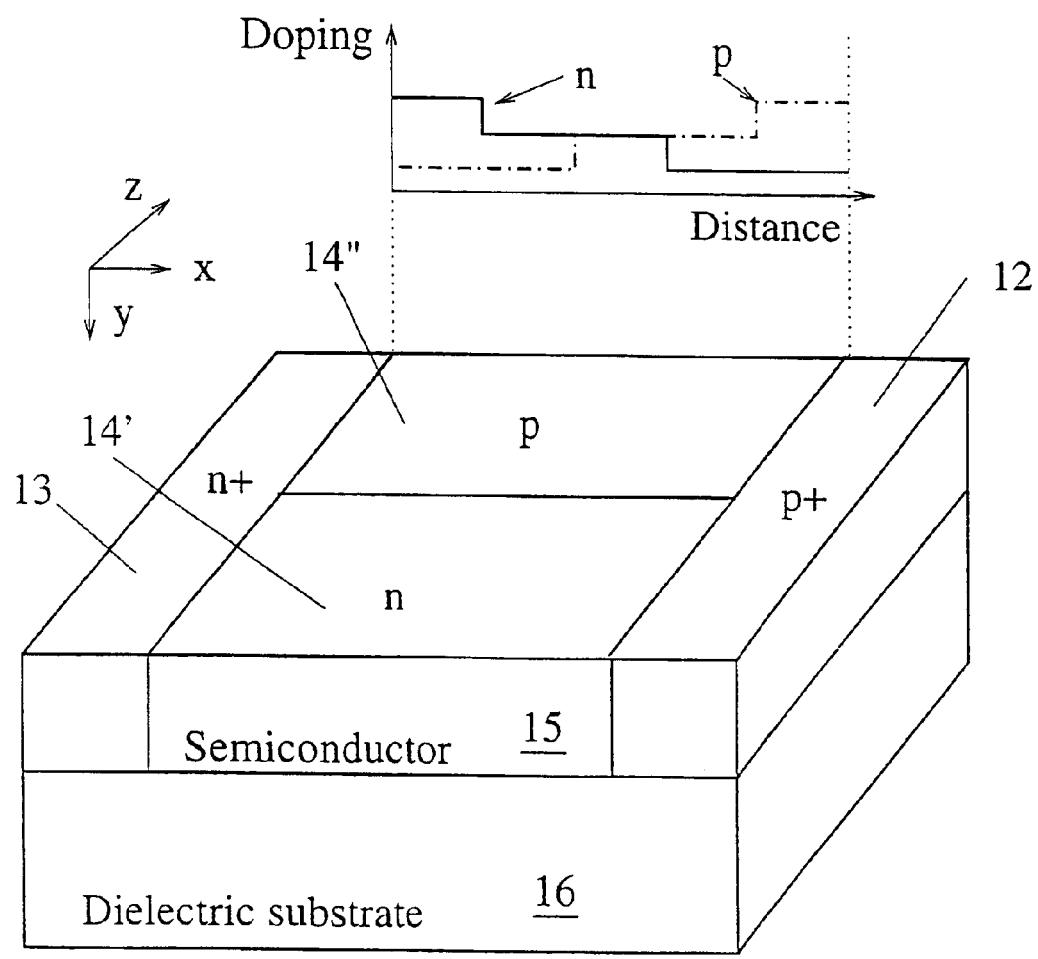

FIG. 12 is a variation of the example shown in FIG. 11 whereby the doping profile in the drift sub-regions 14' and 14" has a non-linear distribution (in the figure a step-like distribution is shown) such that there is an excess in the number of donor atoms in the sub-region 14' compared to the number of acceptor atoms in the drift sub-region 14" close to the region 13 and vice-versa close to the region 12.

These variations in shape and doping profiles may be combined such that the charge in at least one of the sub-regions 14',14" is caused by both a variation of the in-plane section area of the sub-region and a variation of the doping profile.

The charge variation in the sub-regions 14',14" may take a non-linear form. This may be achieved by either varying the doping profile in these regions and/or varying the area in an in-plane section of the sub-regions 14',14" with the distance from the p+ region 12 to the n+ region 13. It is however desirable that the total donor charge in the drift sub-region 14' is approximately equal to the total acceptor charge in the drift sub-region 14".

Figure 13:
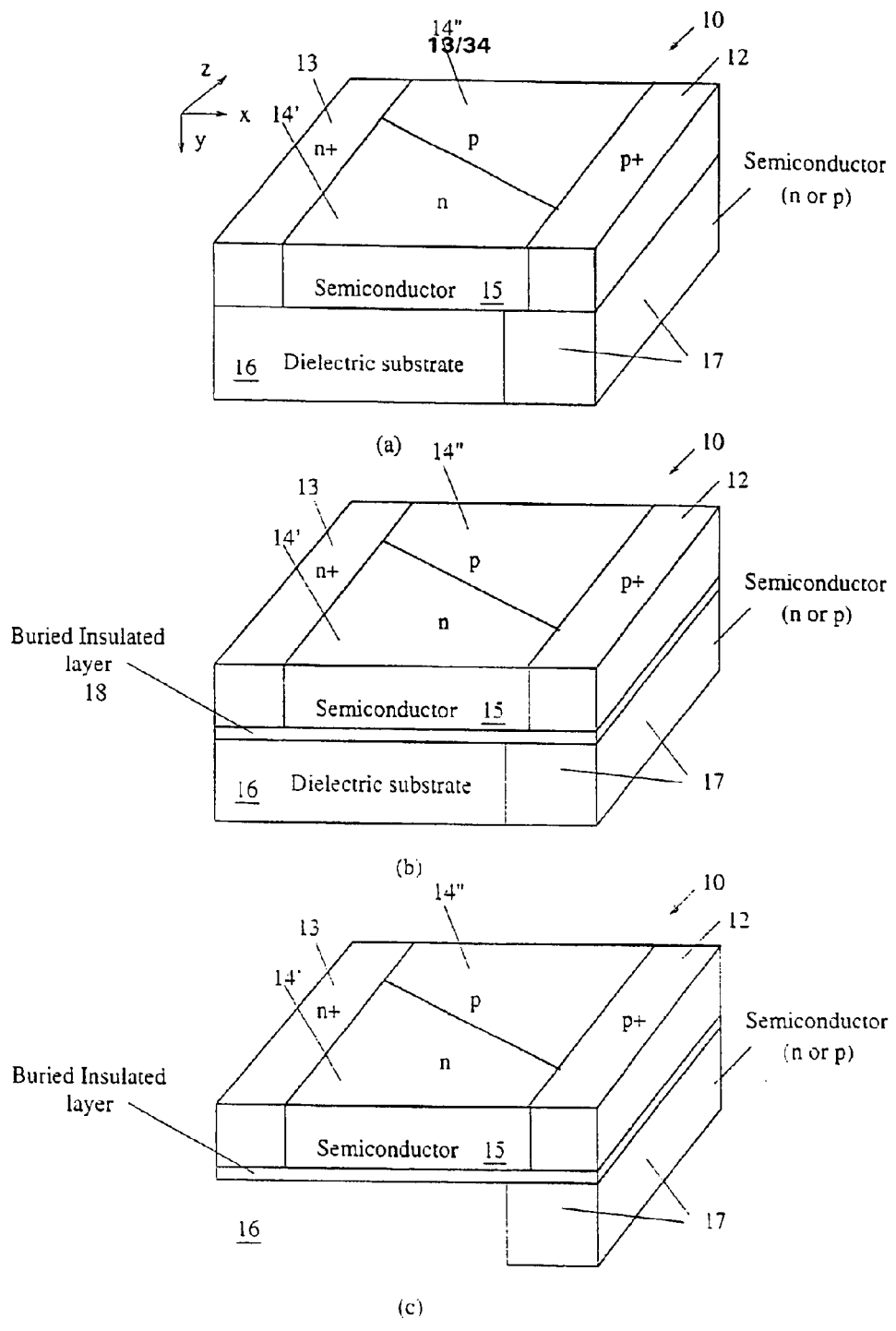

FIG. 13 shows variations of the structure shown in FIG. 12. In FIG. 13(a), the dielectric substrate 16 is only partly placed below the semiconductor layer, preferably below the region connected to the high voltage terminal (i.e. region 13) and part of the drift region 14',14". The region connected to the low voltage terminal (i.e. region 12) and the remaining part of the drift region 14',14" may be placed above a semiconductor substrate 17 which can be either n or p doped. In FIG. 13(b), the semiconductor substrate 17 and the dielectric substrate 16 are isolated from the active semiconductor layer 15 by an additional buried insulating layer 18. The structure in FIG. 13(b) can be fabricated by using standard SOI (Silicon-on-Insulator) substrates followed at one point in the process by back-etching part of the original semiconductor substrate 17 up to the buried insulating layer 18 and subsequently forming the dielectric substrate 16. In this way there is no semiconductor layer under the high voltage end of the drift sub-regions 14',14". In FIG. 13(c), the solid dielectric substrate 16 is replaced by air and the structure 10 takes the shape of a membrane suspended by the semiconductor substrate 17 (only a half cell being shown).

Figure 14:
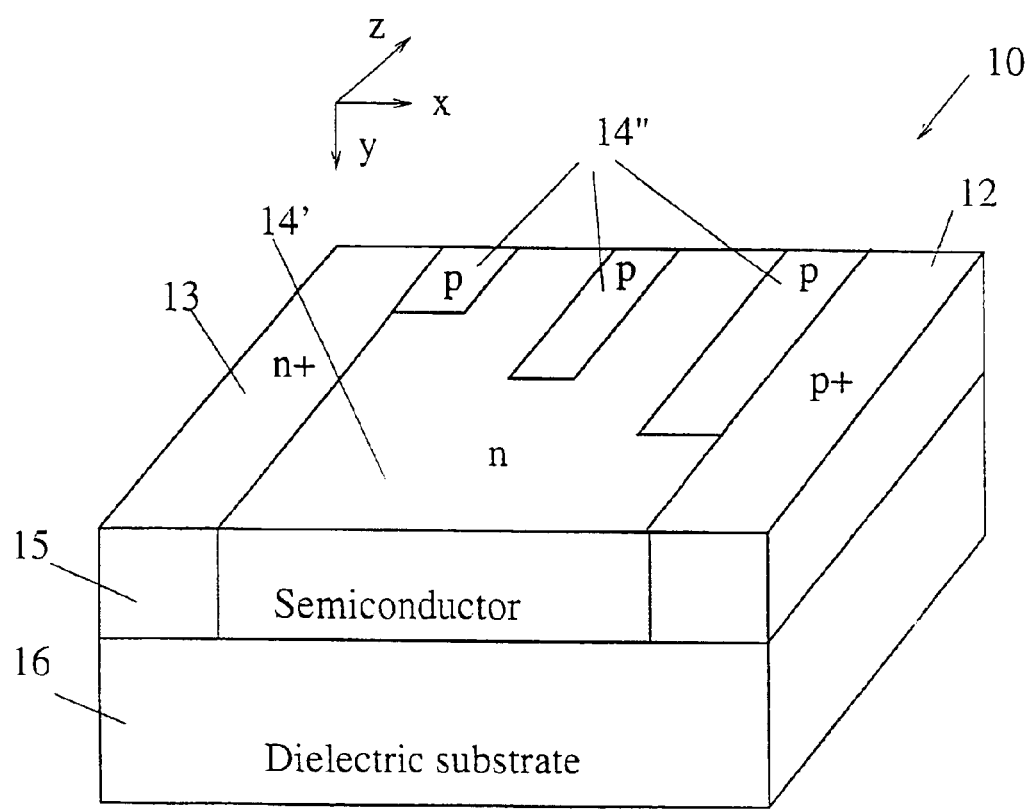

FIG. 14 shows a variation of the example shown in FIG. 8 whereby the drift sub-region 14" is comprised of several islands within the drift sub-region 14'. The ion charge in the islands 14" increases when moving along the device from region 13 to region 12. This can be achieved by either varying the in-plane area of the islands (as shown in FIG. 14), the doping of the islands (not shown) or both.

Figure 15:
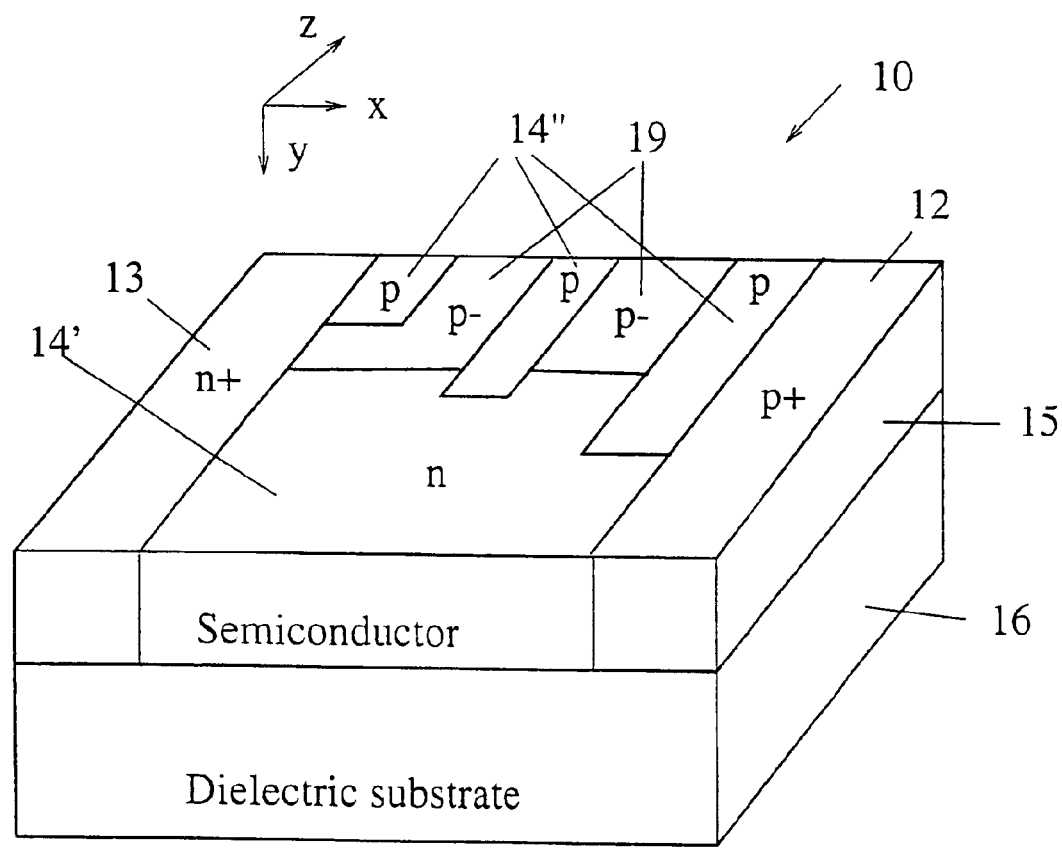

FIG. 15 shows a variation of the example shown in FIG. 14 whereby the islands 14" are connected by a background layer 19, preferably of the same conductivity type and lower doping concentration than that of the islands.

Figure 16:
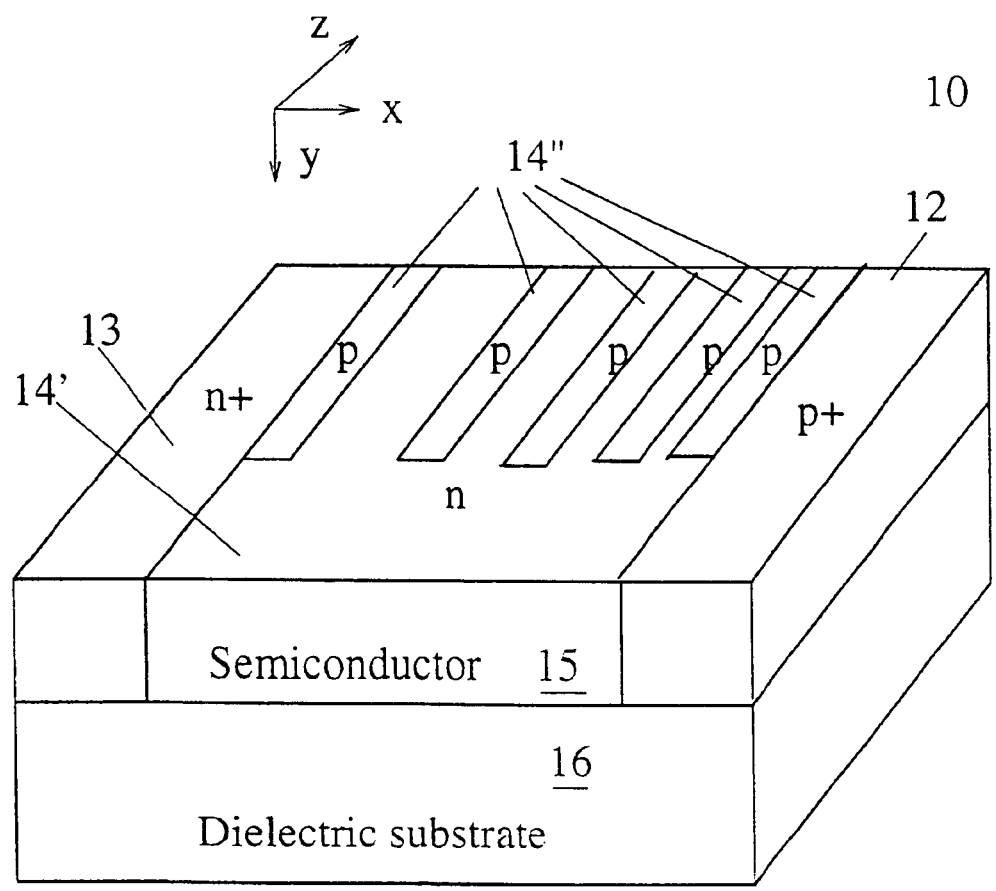

FIG. 16 shows a variation of the example shown in FIG. 14 whereby the charge variation in the sub-region 14" with respect to the charge in the sub-region 14' is achieved through varying the spacing between the islands 14". The spacing is greater close to region 13 and becoming smaller and smaller towards region 12.

Figure 17:
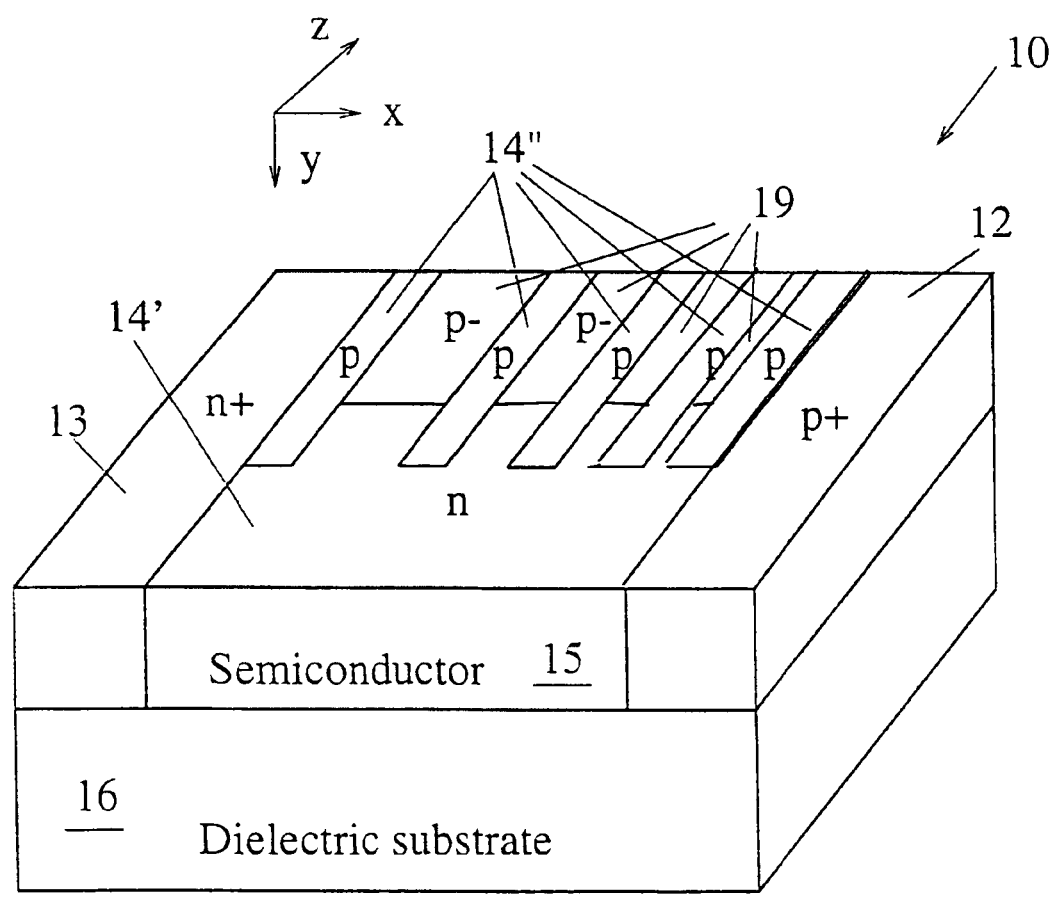

FIG. 17 shows a variation of the example shown in FIG. 16 whereby the islands 14" are connected by a background layer 19, preferably of the same conductivity type and lower doping concentration than that of the islands.

Figure 18:
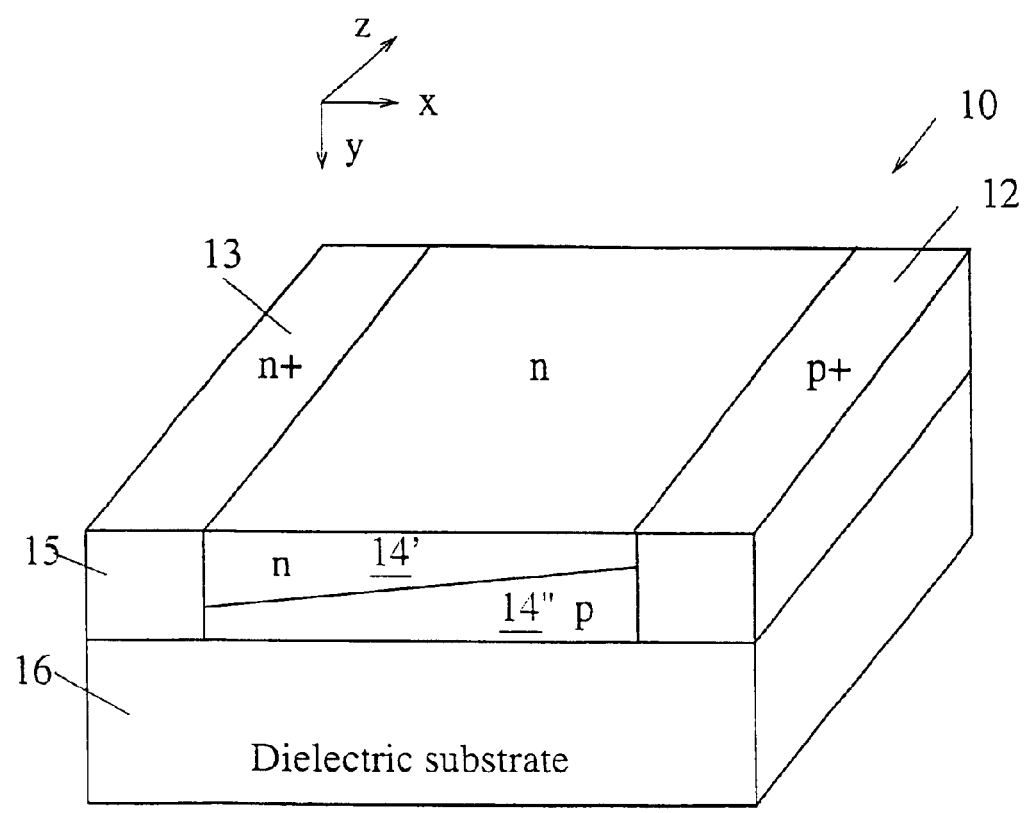
Figure 19:
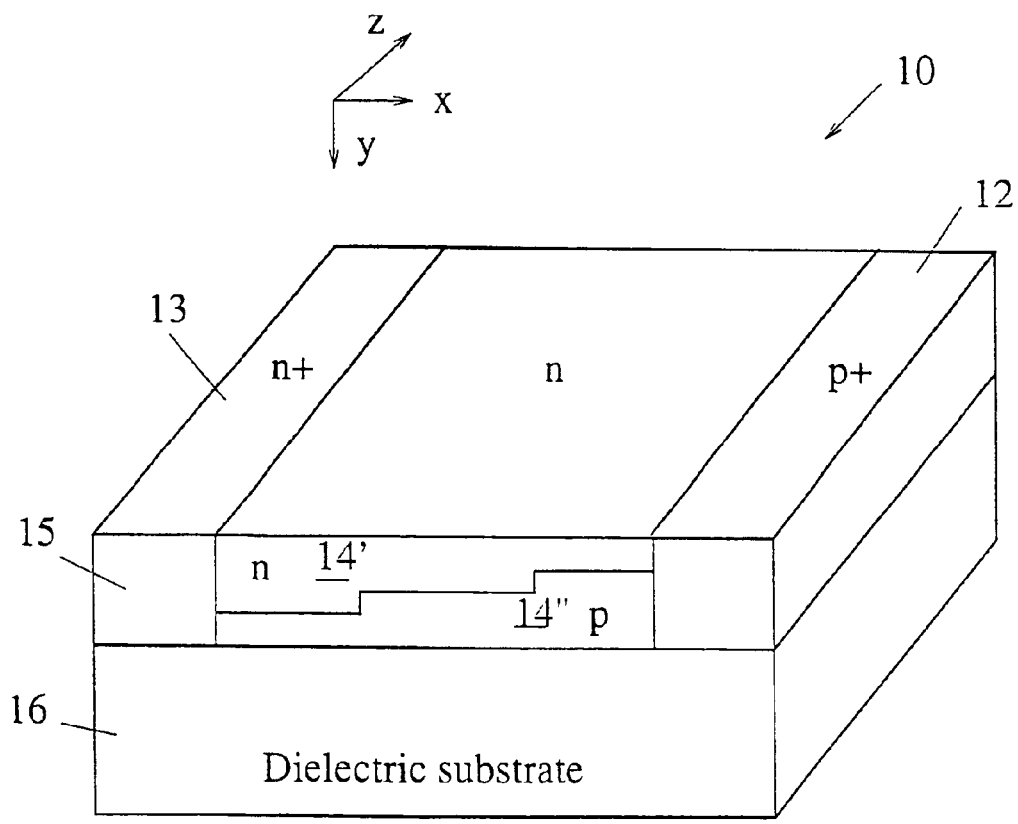
Figure 20:
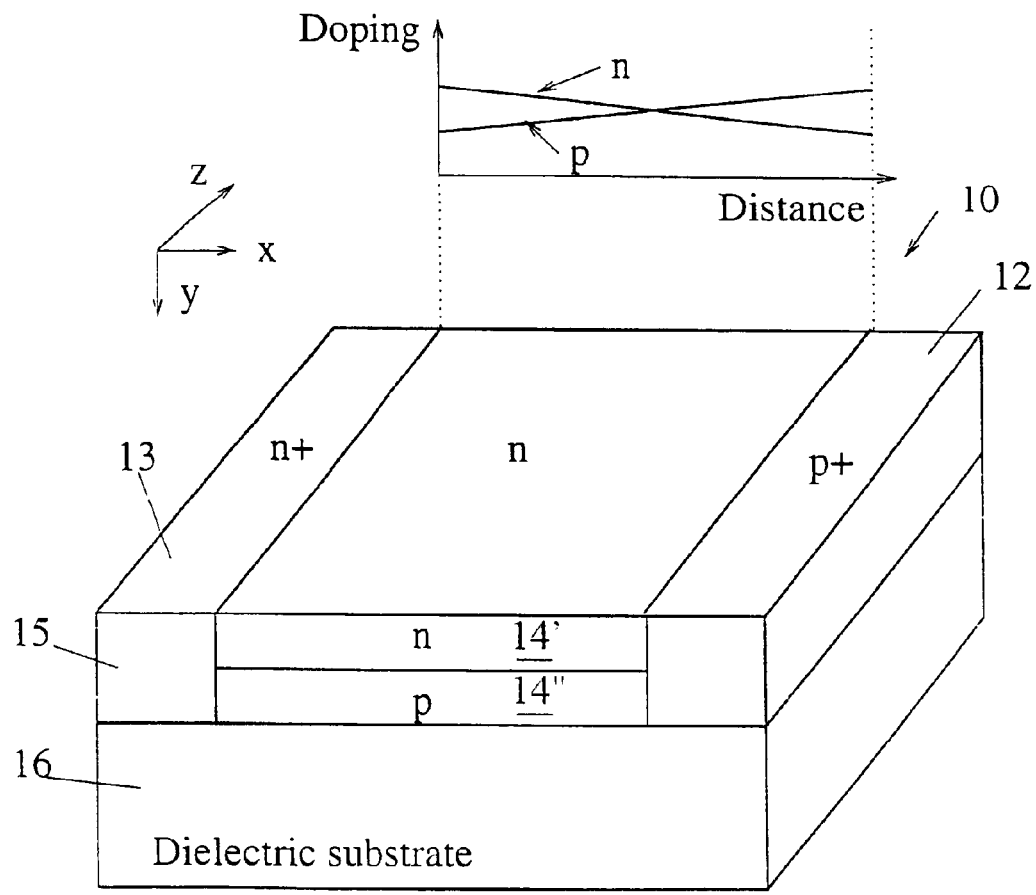
Figure 21:
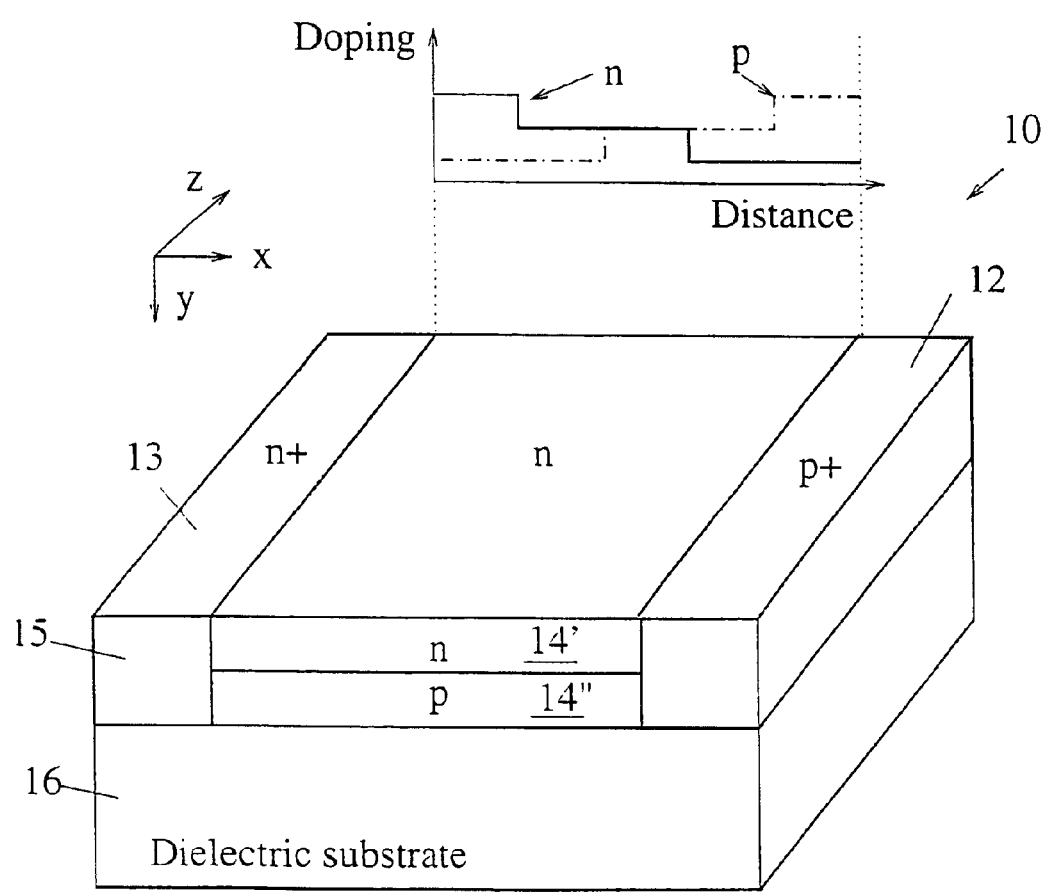
Figure 22:
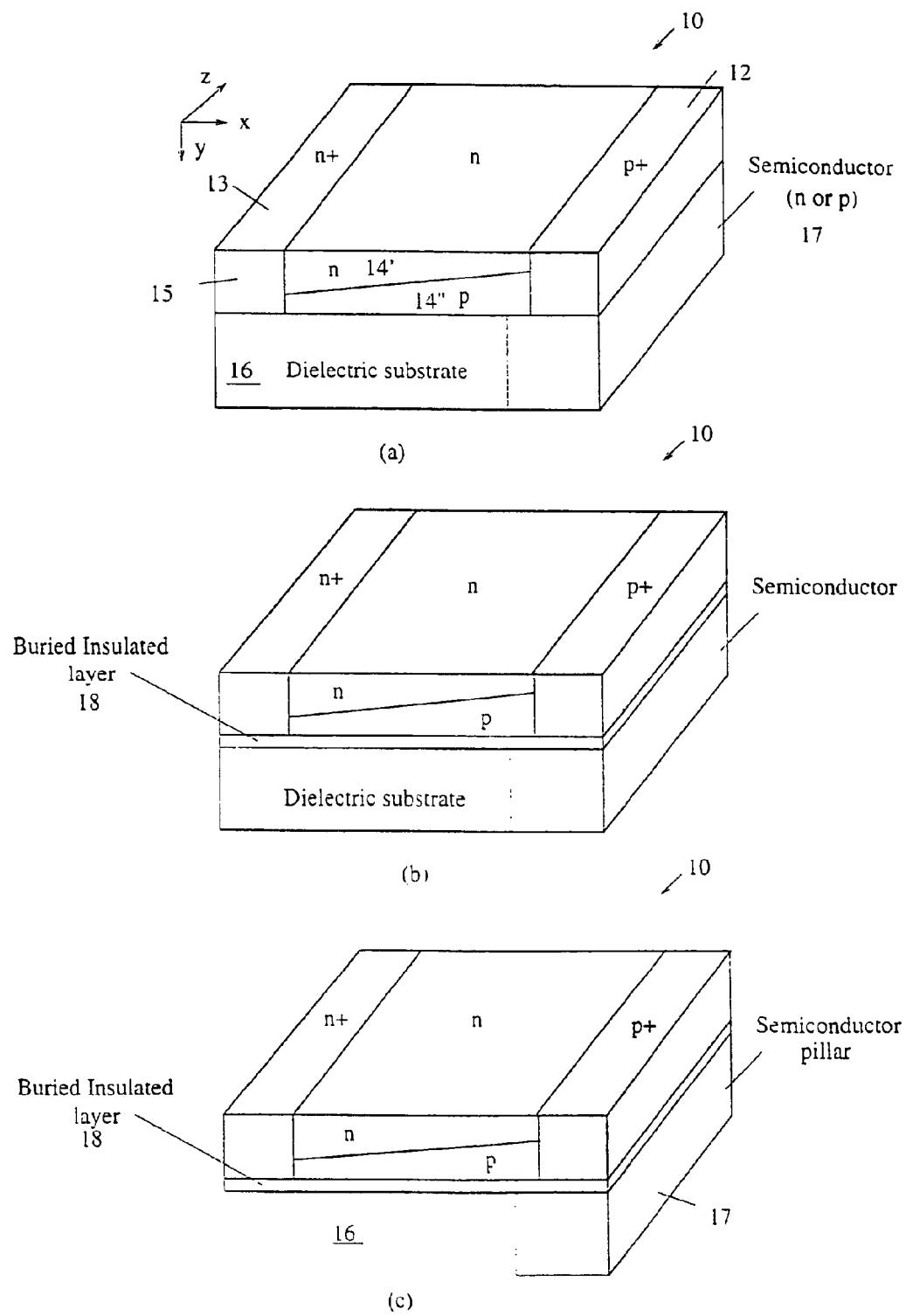

FIG. 18 shows another embodiment of this invention whereby the drift sub-regions 14' and 14" are displaced vertically above each other in the direction of the y axis. This is different to the device shown in FIG. 8 whereby the drift sub-regions 14',14" are displaced in the third dimension along the z axis. Similarly to the device shown in FIG. 8, the drift sub-regions 14',14" are arranged such that when a reverse voltage bias is applied across the terminals connected to the p+ region 12 and n+region 13 (e.g. the terminal (not shown) connected to the region 13 is biased with a positive voltage and the terminal (not shown) connected to the region 12 is fixed to ground), an excess of acceptor ion charge is formed in the drift sub-region 14" relative to the donor ion charge of the drift sub-region 14' in an in-plane cross-section of the device in the proximity of the p+ region 12 and further an excess of donor ion charge is formed in the drift sub-region 14' relative to the acceptor ion charge in the drift sub-region 14" in an in-plane cross-section of the device in the proximity of the n+ region 13. The total donor ion charge in the volume of the sub-region 14' may advantageously be equal to the total acceptor ion charge in the volume of the sub-region 14".

FIGS. 19 to 22 show analogous devices to those shown in FIGS. 10 to 13 respectively. In the examples shown in FIGS. 19 to 22, the drift sub-regions 14',14" are displaced vertically above each other in the direction of the y axis whereas in FIGS. 10 to 13, the drift sub-regions 14',14" are displaced in the third dimension along the z axis.

FIG. 23 shows an example of device shown in FIG. 18 that aims to achieve a breakdown voltage of 600 V. The semiconductor layer is made of silicon ($\epsilon_r$=11.9) and the dielectric substrate is considered to have a relative permittivity of 1 ($\epsilon_r$=1). The doping of the n and p drift sub-regions 14' and 14" is in the range of $10^{16}$ cm$^{-3}$ and the length L of the drift sub-regions is 40 micrometers. The thickness of the semiconductor layer 15 is 2 micrometers. The doping of the p+ and n+ regions 12,13 are considerably higher than those of the drift sub-regions and in this example they are in the order of $10^{20}$ cm$^{-3}$. The variation of the charge in the drift sub-regions 14',14" when moving along the axis x from the region 13 to region 12 can be expressed by the angle $\alpha$ of the transverse junction with the horizontal axis x or by the displacement of the transverse junction in the y direction with respect to the horizontal axis x, at one of the ends of the drift region (junction P+/n or n+/p). The displacement is termed "tilt" and is shown in FIG. 23. The structure in FIG. 23 has been simulated using advanced numerical simulators. The breakdown characteristics for three situations no tilt, an optimum tilt of 0.1 micrometers and an over-tilt of 0.4 micrometers are shown in FIG. 24. There is an optimum value of the tilt (or angle $\alpha$) to obtain a maximum breakdown voltage. The breakdown ability is greatly improved if the transverse junction between the two drift sub-regions is tilted but an over-tilt may result in a lower breakdown voltage as indicated in FIG. 24. This can be explained by looking at FIG. 25 which shows the two-dimensional electric field distribution in the drift region in a cross-section of the device at the breakdown voltage. If no tilt is present, the device exhibits two electric field peaks at the p+/n and n+/p junctions. If an optimum tilt (0.1 micrometers in this case) is present the electric field peaks at these junctions are reduced and the device breaks down ideally at the same time at the n+/p, p+/n junctions and in the middle of the n/p transverse junction. If an over-tilt is present, the device breaks down in the middle of the n/p transverse junction.

The numerical simulations described above have been carried out considering a relative permittivity equal to unity (corresponding to air). For the structure of the example shown in FIG. 23, the optimum tilt was 0.1 micrometers in this case. However, if the dielectric substrate has a higher permittivity (e.g. sapphire has $\epsilon_r$=9.5), the optimum tilt to achieve a maximum breakdown voltage is expected to be well in excess of 0.1 micrometers. The higher the ratio between the permittivity of the dielectric substrate and that of the semiconductor layer, the higher the optimal tilt needed (or the angle of the transverse junction with respect to the horizontal axis) to achieve a maximum breakdown voltage.

FIGS. 26(a) and (b) show examples of a combination of the devices shown in FIGS. 8 and 18. The drift sub-regions 14',14" have both a lateral and vertical arrangement. The variation of the charge in FIG. 26(a) is achieved by tilting the lateral transverse junction between the drift sub-regions 14',14". FIG. 26(b) shows both a lateral and a vertical tilt of the transverse junction. It is also possible to have only a vertical tilt of the transverse junction (not shown).

FIGS. 27 to 30 show schematically examples of n-channel single gate MOSFETs 30 according to embodiments of the present invention having trapezoidal p and n drift sub-regions 14',14". P-channel devices can be built by exchanging the positions of all the n and p type regions, as will be well understood.

In order to form a MOSFET, a MOSFET channel must be formed at the surface of the device. This can be accomplished by replacing part of the p+ region 12 of the device 10 shown in FIG. 8 with a p layer 34 just before the n drift sub-region 14' as shown schematically in FIGS. 27 to 30. The p layer 34 also acts as the p well where the usual MOSFET channel is formed. The usual n+ source 35 and the p+ short 36 at the source end and the n well 37 and n+ drain region 38 at the drain end are also provided. In the forward blocking state, the interaction between the p/n junctions and the dielectric substrate is similar to that described above in the SOD diode shown in FIGS. 8 and 18. In the on state, the p layer 34 can be inverted by applying a potential higher than the threshold voltage to the MOSFET gate (G1) 33. Electrons will then flow from the source terminal 32, n+ source 35 through the channel formed in the p layer 34, n drift sub-region 14' to the drain region 37 (n well), 38(n+ drain) and the drain terminal 31.

Compared to a standard MOSFET, this structure has the advantage that the doping concentration of the sub-regions 14",14' can be increased by for example one or two orders of magnitude above that of a drift layer in the standard MOSFET for the same voltage supported in the off-state blocking mode. Thus the average doping of the sub-regions 14",14' can be of orders of $10^{16}$ cm$^{-3}$ compared to $10^{15}$ cm$^{-3}$ in standard devices. By tilting the transverse junction formed between the sub-regions 14",14', the peaks of the electric field at the p+/n and n+/p junctions can be further reduced, thus increasing the breakdown voltage. The optimal angle of the transverse junction (or the tilt of the junction) is dependent on the ratio between the permittivities of the dielectric substrate and the semiconductor layer placed above.

Figure 27:
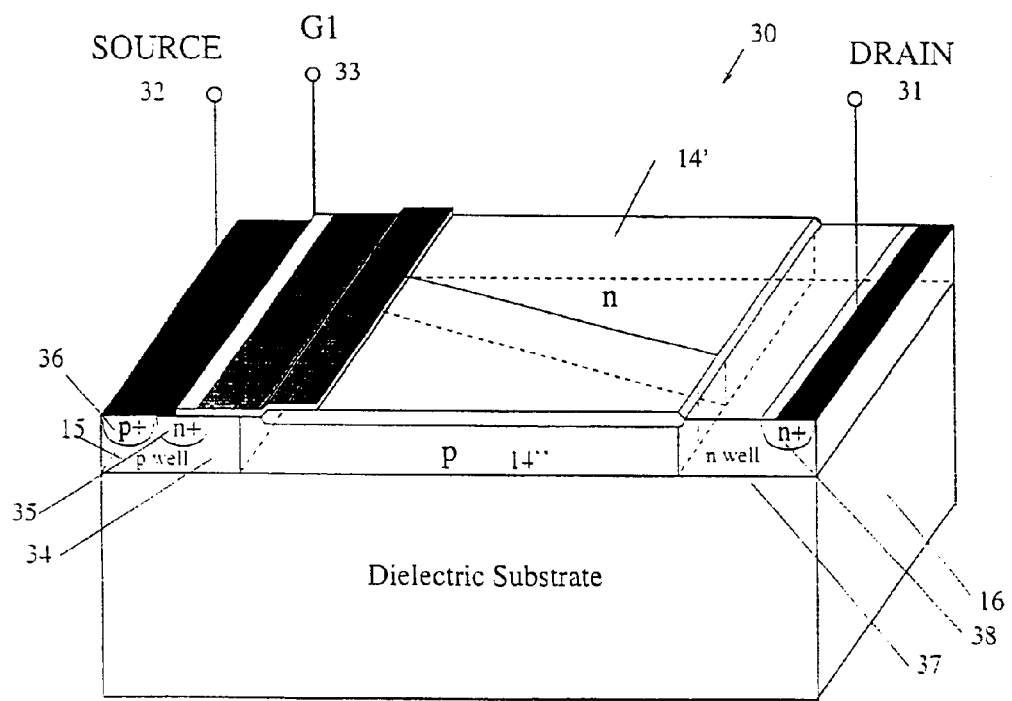
Figure 28:
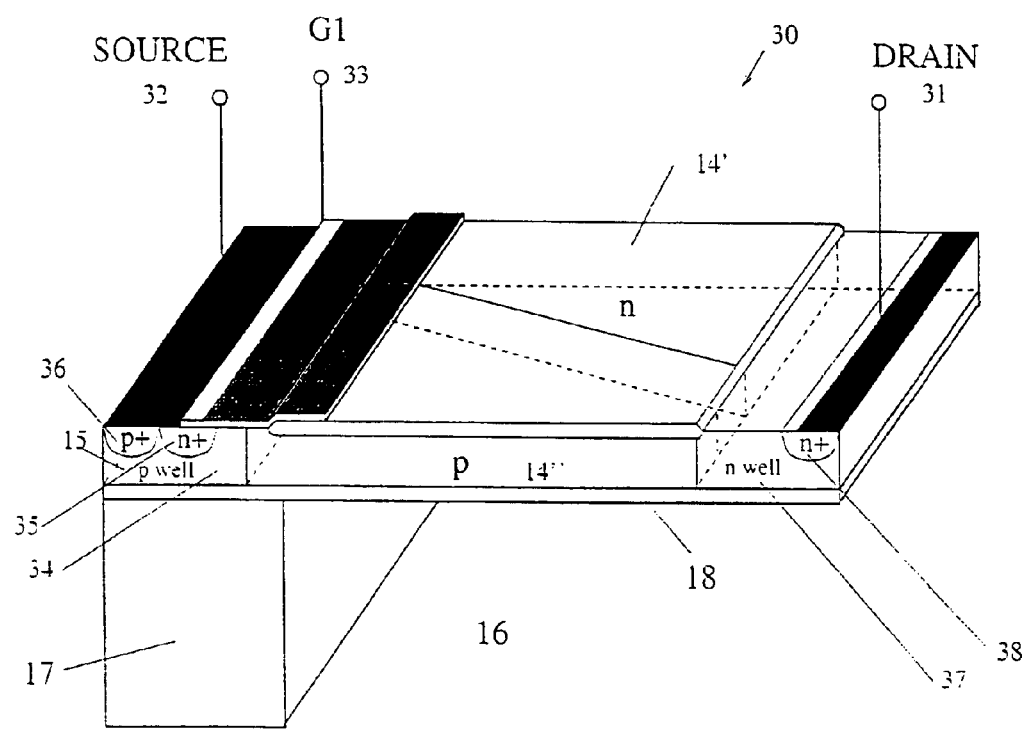
Figure 29:
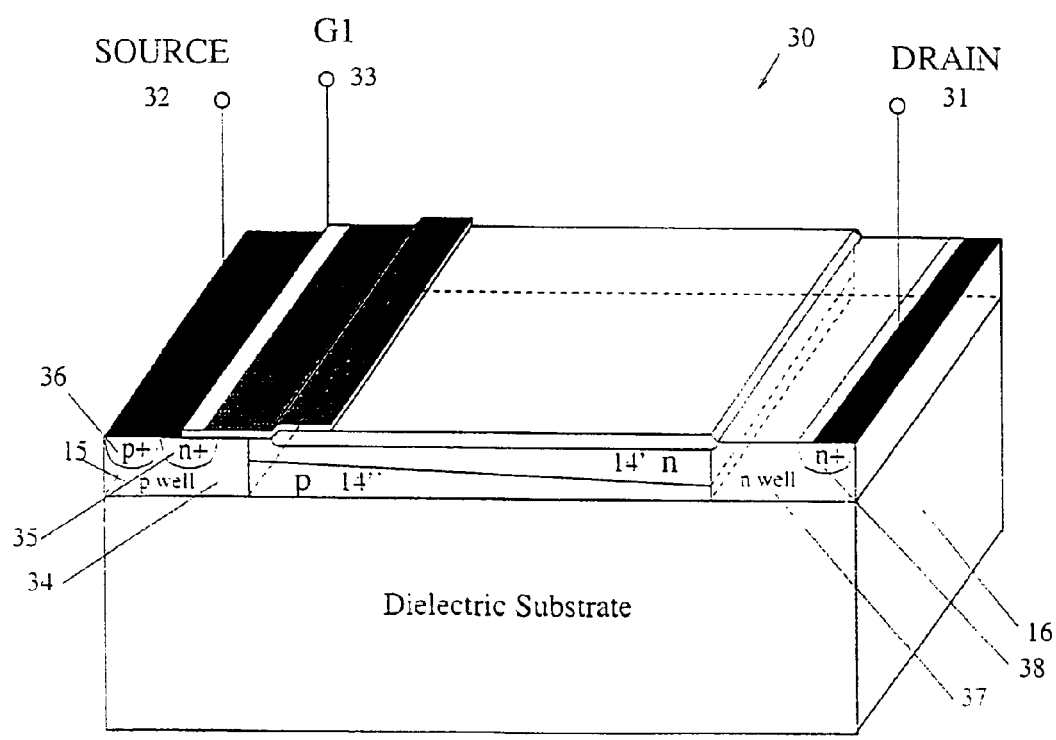
Figure 30:
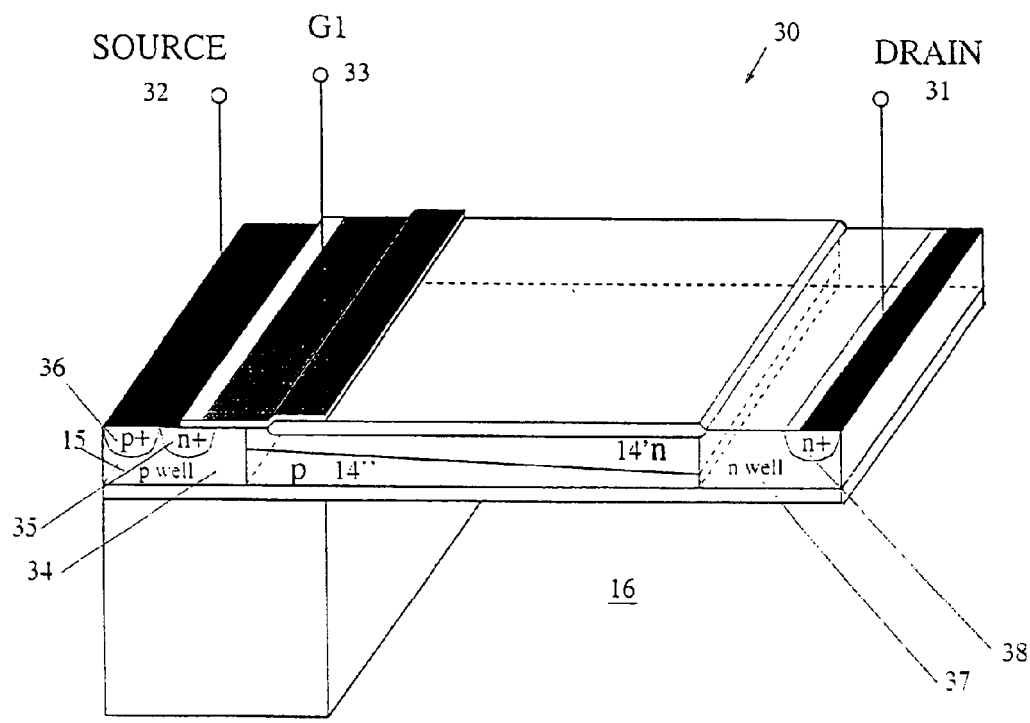
Figure 31:
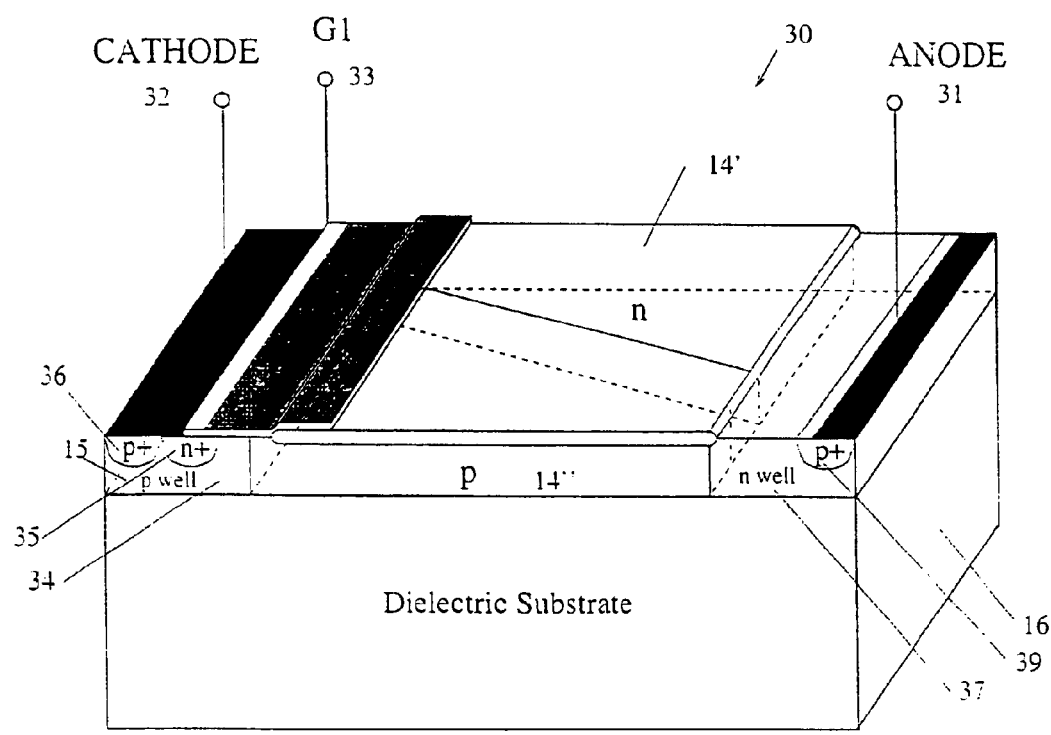
Figure 32:
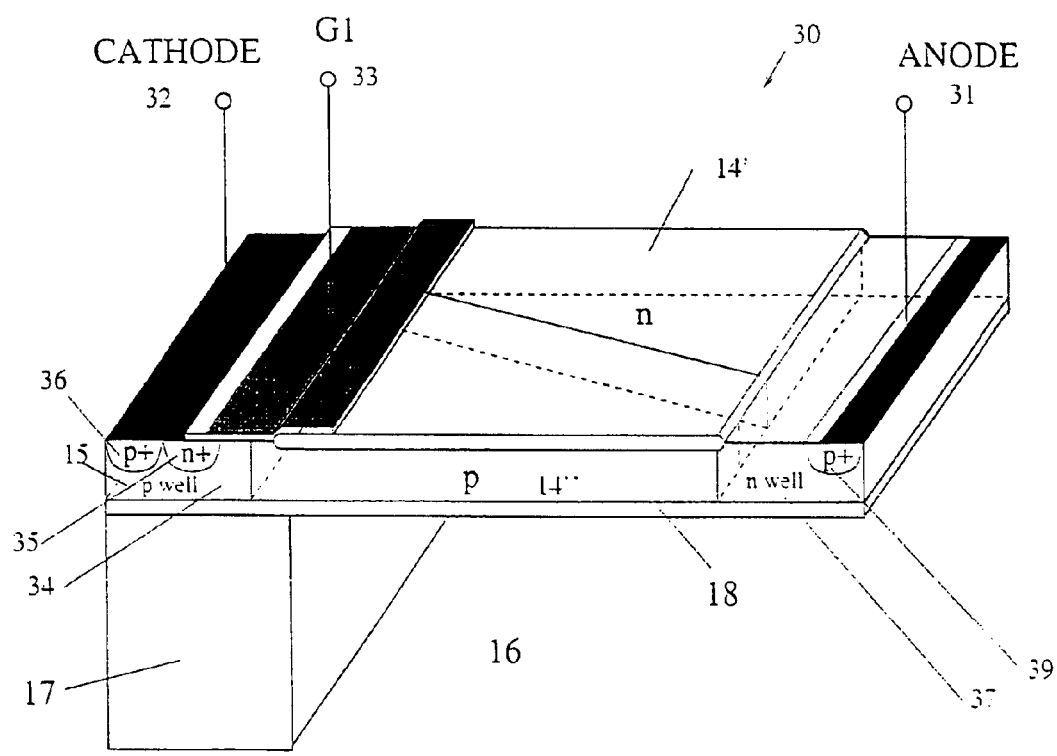
Figure 33:
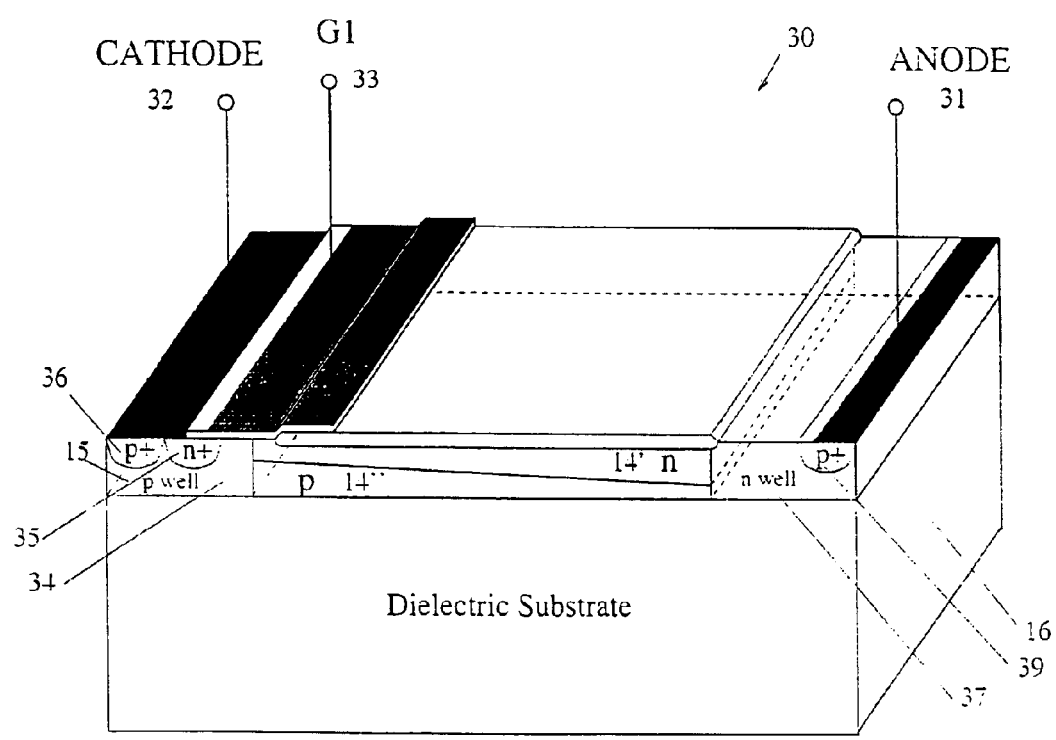
Figure 34:
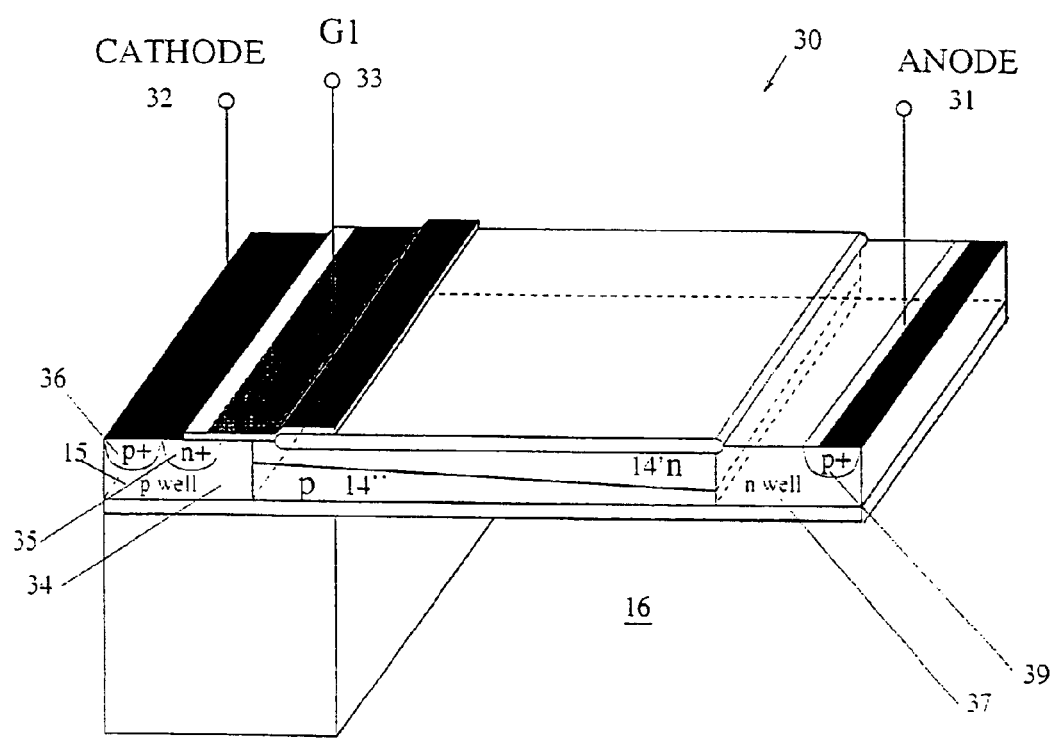

FIG. 27 shows in particular a MOSFET corresponding to the diode example shown in FIG. 8 whereby the drift sub-regions 14',14" are displaced laterally in the in-plane direction. FIG. 28 shows a MOSFET corresponding to the diode example shown in FIG. 13(c). FIG. 29 shows a MOSFET corresponding to the diode example shown in FIG. 18 whereby the drift sub-regions 14',14" are displaced vertically above each other. FIG. 30 shows a MOSFET corresponding to the diode example shown in FIG. 22(c).

FIGS. 31 to 34 show examples of a Lateral Insulated Gate Bipolar Transistor (LIGBT) according to the main embodiments of the present invention. FIGS. 31 to 34 show LIGBTs corresponding to the lateral MOSFETs of FIGS. 27 to 30 respectively. In FIGS. 31 to 34, compared to FIGS. 27 to 30 the n+ drain 38 was replaced with a hole injector, a p+ anode layer 39. The LIGBT is a bipolar device operating in high injection mode. The p+ layer 39 is responsible for injecting holes during on-state operation. During on-state, a high concentration of mobile carriers, holes and electrons in equilibrium, is established in the drift sub-regions 14',14" which lower the resistivity of this layer. The off-state operation is similar to that of the MOSFET with the SOD diode acting to block the voltage between the main terminals when the gate G1 is off. The LIGBT main terminals are commonly called Emitter and Collector or Cathode and Anode respectively. The Source and Drain in FIGS. 27 to 30 correspond to the Cathode and Anode respectively in FIGS. 31 to 34.

There has thus been disclosed a technique for achieving high breakdown voltages on SOD wafers having a substrate of a dielectric material, such as sapphire, diamond, air, aluminium nitride or a combination of the above. In the preferred embodiment, this is provided by a structure having three main lateral junctions, two of which are parallel to each other and transverse to the line joining the p+ and n+ regions 12,13 and the third of which connects the other two and is at an acute angle thereto, each junction being formed in the semiconductor layer 15. The angle of the transverse junction depends on the permittivity of the dielectric substrate. The higher the permittivity of the substrate with respect to that of silicon, the higher the angle is.

An embodiment of the present invention has been described with particular reference to the examples illustrated. However, it will be appreciated that variations and modifications may be made to the examples described within the scope of the present invention. For example, whilst the transverse junction between the p and n drift sub-regions 14',14" is linear or stepped in the examples described above, the junction may have another configuration, including for example curved or flared or serpentine or may have some irregular shape.

Embodiments of the present invention have been described with particular reference to the examples illustrated. However, it will be appreciated that variations and modifications may be made to the examples described within the scope of the present invention.

What is claimed is:

1. A lateral semiconductor device, the device comprising a semiconductor layer on an insulating substrate, the semiconductor layer having a first region of a first conduction type and a second region of a second conduction type with a drift region therebetween, the drift region being provided by a third region of the first conduction type and a fourth region of the second conduction type, the third and fourth (drift) regions being so arranged that when a reverse voltage bias is applied across the first and second regions of the semiconductor layer, the third region has locally in the proximity of the first region an excess of impurity charge relative to the fourth region, and the fourth region has locally in the proximity of the second region an excess of impurity charge relative to the third region, and the total volume charge in the third region is substantially equal to the total volume charge in the fourth region.

2. A device according to claim 1, wherein only part of the drift region is placed above an insulating substrate, the rest of the substrate comprising at least a region of semiconductor material.

3. A device according to claim 1, wherein the largest part of the drift region is placed above an insulating substrate such that the high voltage end of the drift region has no semiconductor layer underneath and the low voltage end of the drift region is positioned over a substrate that contains at least a region of semiconductor material.

4. A device according to claim 1, wherein the third (drift) region is continuous along the device from the first region to the second region.

5. A device according to claim 1, wherein the fourth (drift) region is continuous along the device from the first region to the second region.

6. A device according to claim 1, wherein the third (drift) region is provided by or includes a plurality of semiconductor islands in the fourth (drift) region.

7. A device according to claim 6, wherein the islands are electrically floating.

8. A device according to claim 1, wherein the fourth (drift) region is provided by or includes a plurality of semiconductor islands in the third (drift) region.

9. A device according to claim 8, wherein the islands are electrically floating.

10. A device according to claim 1, wherein the third (drift) region includes or is provided by a plurality of semiconductor islands in a common silicon background layer having lower doping than any of the third (drift) regions.

11. A device according to claim 10, wherein the background layer has the same conductivity type as the islands such that said islands are electrically connected to each other by the background layer.

12. A device according to claim 1, wherein the fourth (drift) region includes or is provided by a plurality of semiconductor islands in a common silicon background layer having lower doping than any of the fourth (drift) regions.

13. A device according to claim 1, wherein the charge variation in the third and fourth regions is a function of the permittivity of the insulating substrate such that the higher the dielectric permittivity of the insulating substrate the higher the slope of the charge variation in the third and fourth drift regions.

14. A device according to claim 1, wherein the charge variation in the third and fourth regions along the device structure from the first region to the second region is achieved by varying the in-plane area of these regions.

15. A device according to claim 1, wherein the charge variation in the third and fourth regions along the device structure from the first region to the second region is achieved by varying the impurity doping concentration of these regions.

16. A device according to claim 15, wherein the doping concentration in the third region varies with a positive slope from the first region to the second region while the doping concentration in the third region varies with a negative slope from the first region to the second region such that the average doping concentration in the third region along the device structure from the first to the second region is substantially equal to the average doping concentration in the fourth region along the device structure from the first to the second region.

17. A device according to claim 16, wherein the slope of the doping concentration variation is proportional to the dielectric permittivity of the substrate.

18. A device according to claim 1, wherein the third and the fourth regions are placed adjacent to each other in the third dimension.

19. A device according to claim 1, wherein the third and fourth regions are placed above each other.

20. A device according to claim 1, wherein the semiconductor layer comprises at least one of silicon, silicon-carbide, gallium-arsenide, gallium-nitride and III-V semiconducting materials.

21. A device according to claim 1, wherein the insulating (dielectric) layer comprises at least one of air, sapphire, diamond, aluminium-nitride, silicon dioxide, silicon-nitride, any mould material used for IC packages, and passivation dielectric material known in microelectronics.

22. A lateral semiconductor device, the device comprising a semiconductor layer on an insulating substrate, the semiconductor layer having a first region of a first conduction type and a second region of a second conduction type with a drift region therebetween, the drift region being provided by a third region of the first conduction type and a fourth region of the second conduction type, the third and fourth (drift) regions being so arranged that when a reverse voltage bias is applied across the first and second regions of the semiconductor layer, the impurity charge in the third region varies with a positive slope along the device from the first region to the second region and the charge in the fourth region varies with a negative slope along the device from the first region to the second region and such that the total charge in the volume of the third region is substantially equal to the total charge in the volume of the fourth region.

23. A device according to claim 22, wherein the impurity charge in the third region varies substantially linearly with a positive slope along the device from the first region to the second region.

24. A device according to claim 22, wherein the impurity charge in the fourth region varies substantially linearly with a negative slope along the device from the first region to the second region.

25. A device according to claim 22, wherein only part of the drift region is placed above an insulating substrate, the rest of the substrate comprising at least a region of semiconductor material.

26. A device according to claim 22, wherein the largest part of the drift region is placed above an insulating substrate such that the high voltage end of the drift region has no semiconductor layer underneath and the low voltage end of the drift region is positioned over a substrate that contains at least a region of semiconductor material.

27. A device according to claim 22, wherein the third (drift) region is continuous along the device from the first region to the second region.

28. A device according to claim 22, wherein the fourth (drift) region is continuous along the device from the first region to the second region.

29. A device according to claim 22, wherein the third (drift) region is provided by or includes a plurality of semiconductor islands in the fourth (drift) region.

30. A device according to claim 29, wherein the islands are electrically floating.

31. A device according to claim 22, wherein the fourth (drift) region is provided by or includes a plurality of semiconductor islands in the third (drift) region.

32. A device according to claim 31, wherein the islands are electrically floating.

33. A device according to claim 22, wherein the third (drift) region includes or is provided by a plurality of semiconductor islands in a common silicon background layer having lower doping than any of the third (drift) regions.

34. A device according to claim 22, wherein the fourth (drift) region includes or is provided by a plurality of semiconductor islands in a common silicon background layer having lower doping than any of the fourth (drift) regions.

35. A device according to claim 33, wherein the background layer has the same conductivity type as the islands such that said islands are electrically connected to each other by the background layer.

36. A device according to claim 22, wherein the charge variation in the third and fourth regions is a function of the permittivity of the insulating substrate such that the higher the dielectric permittivity of the insulating substrate the higher the slope of the charge variation in the third and fourth drift regions.

37. A device according to claim 22, wherein the charge variation in the third and fourth regions along the device structure from the first region to the second region is achieved by varying the in-plane area of these regions.

38. A device according to claim 22, wherein the charge variation in the third and fourth regions along the device structure from the first region to the second region is achieved by varying the impurity doping concentration of these regions.

39. A device according to claim 38, wherein the doping concentration in the third region varies with a positive slope from the first region to the second region while the doping concentration in the third region varies with a negative slope from the first region to the second region such that the average doping concentration in the third region along the device structure from the first to the second region is substantially equal to the average doping concentration in the fourth region along the device structure from the first to the second region.

40. A device according to claim 39, wherein the slope of the doping concentration variation is proportional to the dielectric permittivity of the substrate.

41. A device according to claim 22, wherein the third and the fourth regions are placed adjacent to each other in the third dimension.

42. A device according to claim 22, wherein the third and fourth regions are placed above each other.

43. A device according to claim 22, wherein the semiconductor layer comprises at least one of silicon, silicon-carbide, gallium-arsenide, gallium-nitride and III–V semiconducting materials.

44. A device according to claim 22, wherein the insulating (dielectric) layer comprises at least one of air, sapphire, diamond, aluminium-nitride, silicon dioxide, silicon-nitride, any mould material used for IC packages, and passivation dielectric material known in microelectronics.

* * * * *